United States Patent
You et al.

(10) Patent No.: US 12,322,653 B2
(45) Date of Patent: Jun. 3, 2025

(54) SELF-ALIGNED METAL GATE FOR MULTIGATE DEVICE AND METHOD OF FORMING THEREOF

(71) Applicant: Taiwan Semiconductor Manufacturing Co., Ltd., Hsinchu (TW)

(72) Inventors: Jia-Chuan You, Taoyuan County (TW); Kuan-Ting Pan, Taipei (TW); Shi Ning Ju, Hsinchu (TW); Kuo-Cheng Chiang, Hsinchu County (TW); Chia-Hao Wang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/231,076

(22) Filed: Aug. 7, 2023

(65) Prior Publication Data

US 2024/0030066 A1  Jan. 25, 2024

Related U.S. Application Data

(62) Division of application No. 17/224,334, filed on Apr. 7, 2021, now Pat. No. 11,961,763.

(Continued)

(51) Int. Cl.
*H01L 21/768* (2006.01)
*H01L 21/02* (2006.01)
(Continued)

(52) U.S. Cl.
CPC .. *H01L 21/76897* (2013.01); *H01L 21/02603* (2013.01); *H01L 21/76805* (2013.01);
(Continued)

(58) Field of Classification Search
CPC ......... H01L 21/76897; H01L 21/02603; H01L 21/76805; H01L 21/76871;
(Continued)

(56) References Cited

U.S. PATENT DOCUMENTS

| | | | |
|---|---|---|---|
| 8,753,942 B2 | 6/2014 | Kuhn et al. | |
| 9,741,810 B2 | 8/2017 | Ching et al. | |

(Continued)

FOREIGN PATENT DOCUMENTS

| | | |
|---|---|---|
| CN | 105374875 A | 3/2016 |
| CN | 109427791 A | 3/2019 |

(Continued)

*Primary Examiner* — Natalia A Gondarenko
(74) *Attorney, Agent, or Firm* — Haynes and Boone, LLP

(57) ABSTRACT

Devices and methods that a first gate structure wrapping around a channel layer disposed over the substrate, a second gate structure wrapping around another channel layer disposed over the substrate and a dielectric fin structure formed over a shallow trench isolation (STI) feature and between the first and second gate structures. At least one metallization layer is formed on the first gate structure, the dielectric fin structure, and the second gate structure and contiguously extends from the first gate structure to the second gate structure.

20 Claims, 32 Drawing Sheets

Related U.S. Application Data

(60) Provisional application No. 62/705,716, filed on Jul. 13, 2020.

(51) Int. Cl.

| | |
|---|---|
| *H01L 23/532* | (2006.01) |
| *H01L 23/535* | (2006.01) |
| *H10D 30/01* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC .. *H01L 21/76871* (2013.01); *H01L 21/76895* (2013.01); *H01L 23/53257* (2013.01); *H01L 23/535* (2013.01); *H10D 30/031* (2025.01); *H10D 30/6713* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/0172* (2025.01); *H10D 84/0186* (2025.01); *H10D 84/038* (2025.01); *H10D 84/85* (2025.01)

(58) Field of Classification Search
CPC ....... H01L 21/76895; H01L 21/823807; H01L 21/823814; H01L 21/823828; H01L 29/0673; H01L 29/42392; H01L 29/66545; H01L 29/66742; H01L 29/78618; H01L 29/78696; H01L 29/0649; H01L 29/0653; H01L 29/42376; H01L 29/66439; H01L 29/775; H01L 21/823431; H01L 21/823821; H01L 21/823878; H01L 27/092; H01L 27/0924; H01L 27/0886; H01L 27/088; H01L 21/823475; H01L 21/76829; H01L 21/823412; H01L 21/823462; H01L 21/823437; H01L 21/823481; H01L 21/823871; H01L 23/53257; H01L 23/535; B82Y 10/00; H10D 30/031; H10D 30/0221; H10D 30/0191; H10D 30/501; H10D 30/608; H10D 30/62; H10D 30/6211; H10D 30/6213; H10D 30/6713; H10D 30/6735; H10D 30/6736; H10D 30/6757; H10D 64/017; H10D 64/021; H10D 64/20; H10D 64/311; H10D 64/411; H10D 84/0167; H10D 84/0107; H10D 84/017; H10D 84/0172; H10D 84/0186; H10D 84/0188; H10D 84/0193; H10D 84/038; H10D 84/85; H10D 84/201; H10D 84/837; H10D 84/853; H10D 18/60; H10D 62/10; H10D 62/117; H10D 62/119; H10D 62/121; H10D 62/122; H10D 62/221; H10D 1/694; H10F 77/955; H10F 30/2863; H10H 20/851; H10H 20/826; H10H 20/8314
USPC .................. 257/351, 365, 328, 308; 438/283
See application file for complete search history.

(56) References Cited

U.S. PATENT DOCUMENTS

| | | | |
|---|---|---|---|
| 9,748,352 | B2 | 8/2017 | Liu et al. |
| 9,754,840 | B2 | 9/2017 | Lin et al. |
| 2013/0065389 | A1* | 3/2013 | Kagawa ............... H01L 27/0207 438/618 |
| 2014/0127901 | A1 | 5/2014 | Lu et al. |
| 2016/0027703 | A1 | 1/2016 | Do et al. |
| 2016/0056153 | A1 | 2/2016 | Do et al. |
| 2018/0182709 | A1 | 6/2018 | Jaywant |
| 2019/0067301 | A1 | 2/2019 | Yang et al. |
| 2019/0067417 | A1 | 2/2019 | Ching |
| 2019/0067435 | A1 | 2/2019 | Badaroglu et al. |
| 2019/0157094 | A1 | 5/2019 | Lin et al. |
| 2019/0189804 | A1 | 6/2019 | You et al. |
| 2019/0378903 | A1* | 12/2019 | Jeon ..................... H01L 27/088 |
| 2020/0006155 | A1 | 1/2020 | Chiang |
| 2020/0098878 | A1 | 3/2020 | Guler |
| 2020/0105889 | A1 | 4/2020 | Liaw |
| 2020/0286891 | A1 | 9/2020 | Subramanian et al. |
| 2020/0287015 | A1* | 9/2020 | Subramanian .... H01L 29/66545 |
| 2021/0242203 | A1 | 8/2021 | Ding et al. |
| 2021/0305250 | A1* | 9/2021 | Yang ................. H01L 21/82385 |
| 2021/0328010 | A1 | 10/2021 | Kim et al. |
| 2021/0367036 | A1* | 11/2021 | Kim .................. H01L 29/42392 |

FOREIGN PATENT DOCUMENTS

| | | |
|---|---|---|
| CN | 109817527 A | 5/2019 |
| CN | 110556374 A | 12/2019 |
| CN | 110957316 A | 4/2020 |
| KR | 20150122270 A | 10/2015 |
| KR | 20160012883 A | 2/2016 |
| KR | 20160022752 A | 3/2016 |
| KR | 20160140321 A | 12/2016 |
| KR | 20190072959 A | 6/2019 |
| KR | 20200003722 A | 1/2020 |
| TW | 201135885 A | 10/2011 |

* cited by examiner

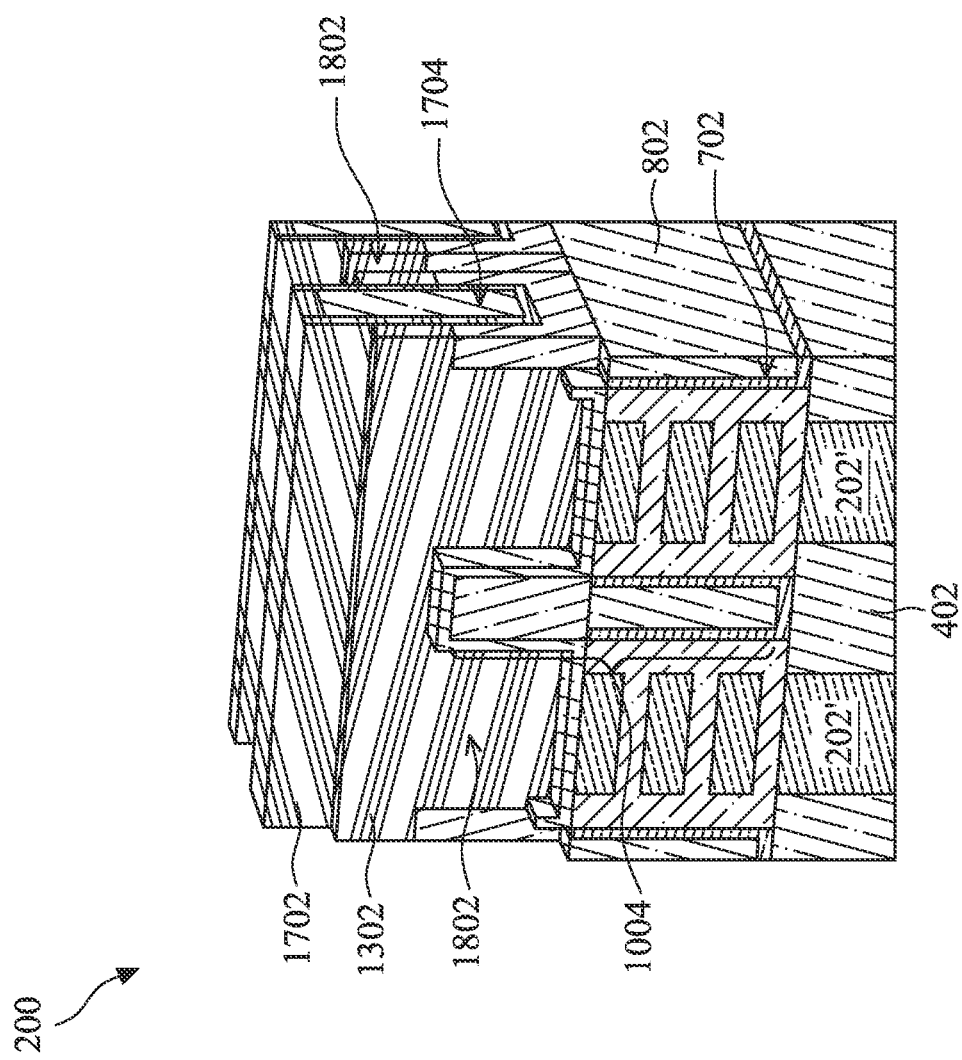

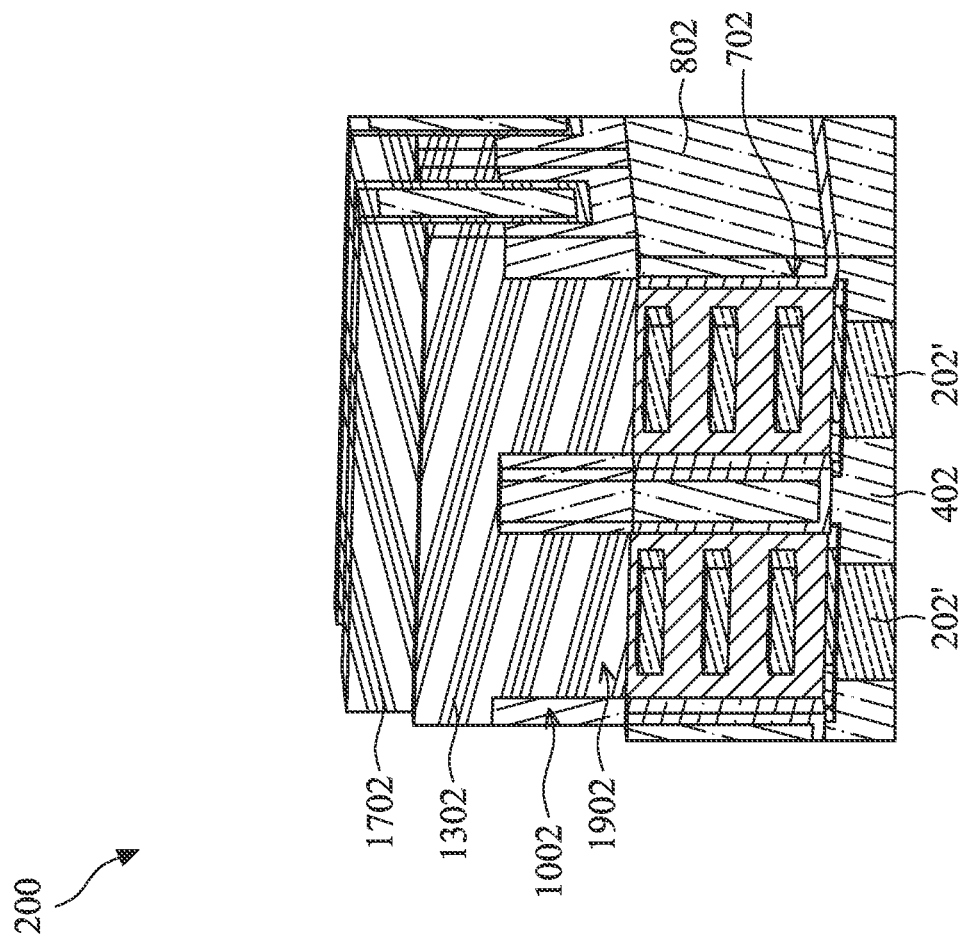

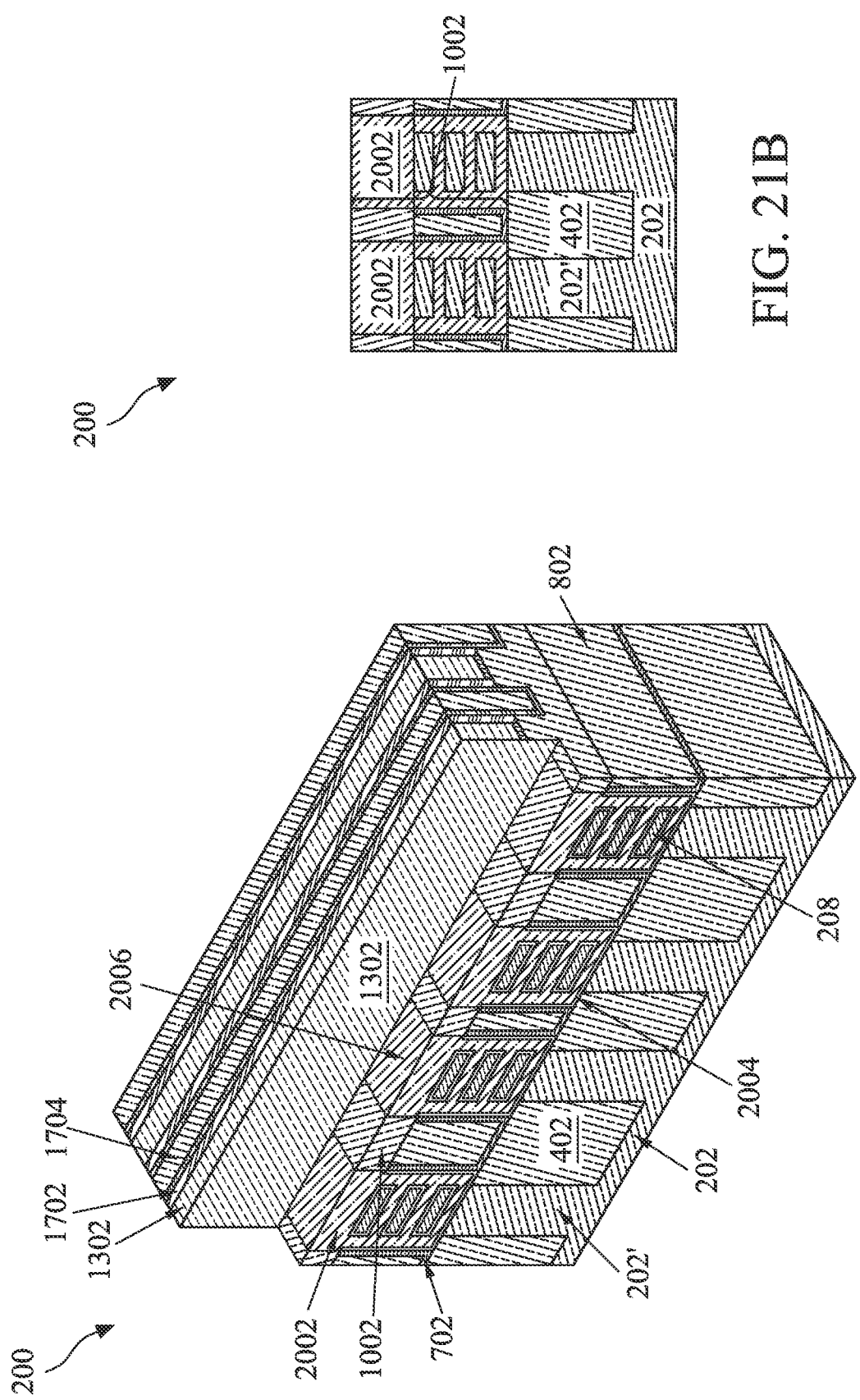

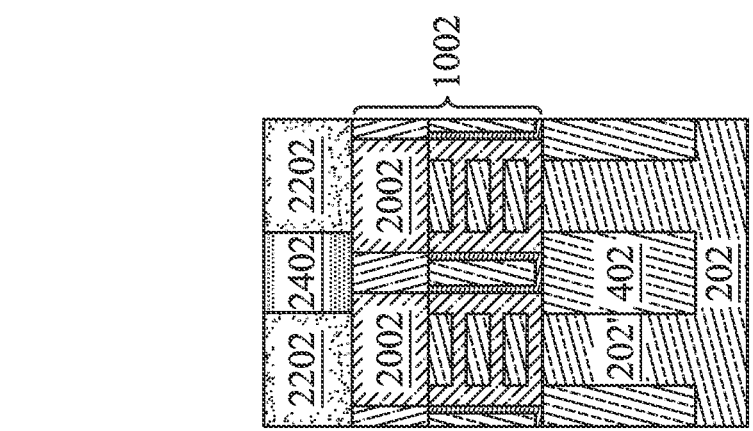
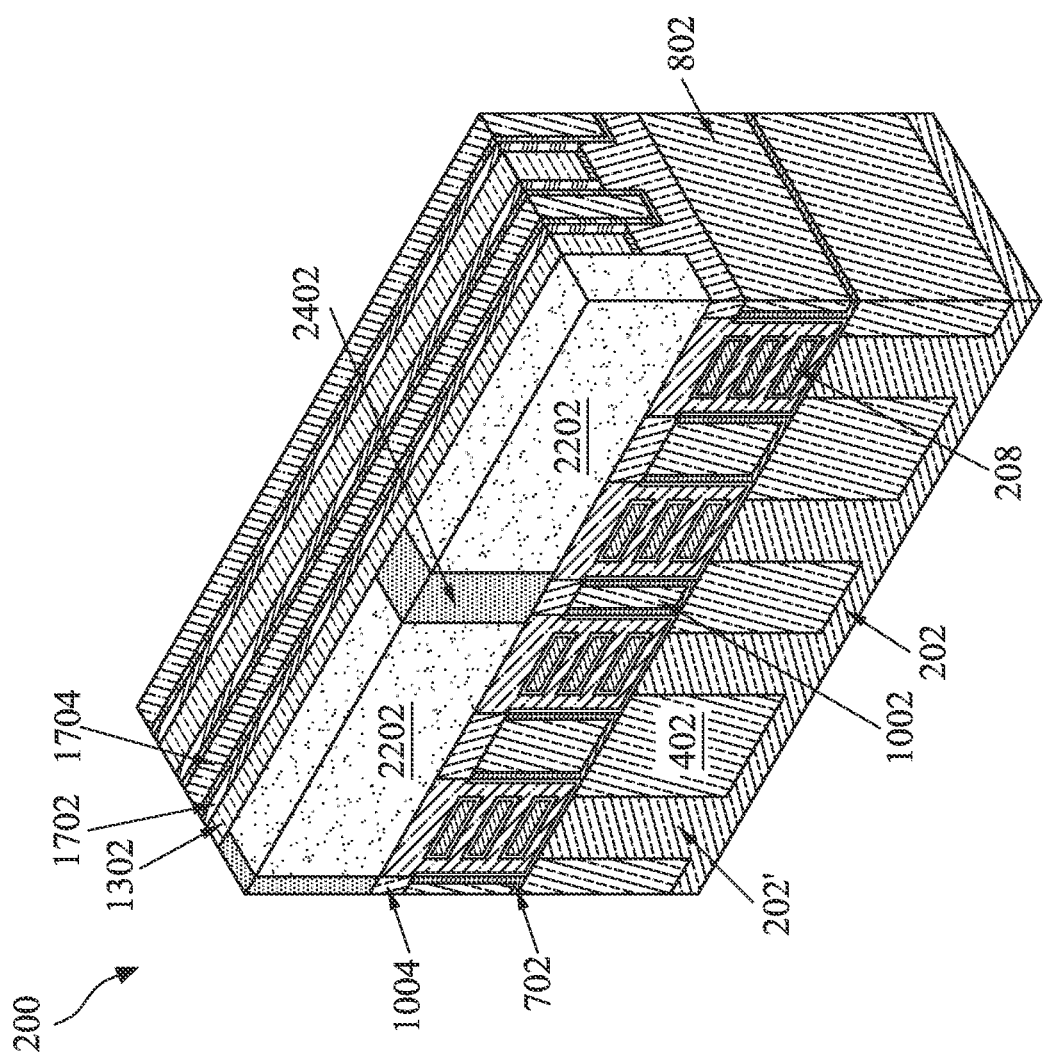
FIG. 24B
FIG. 24A

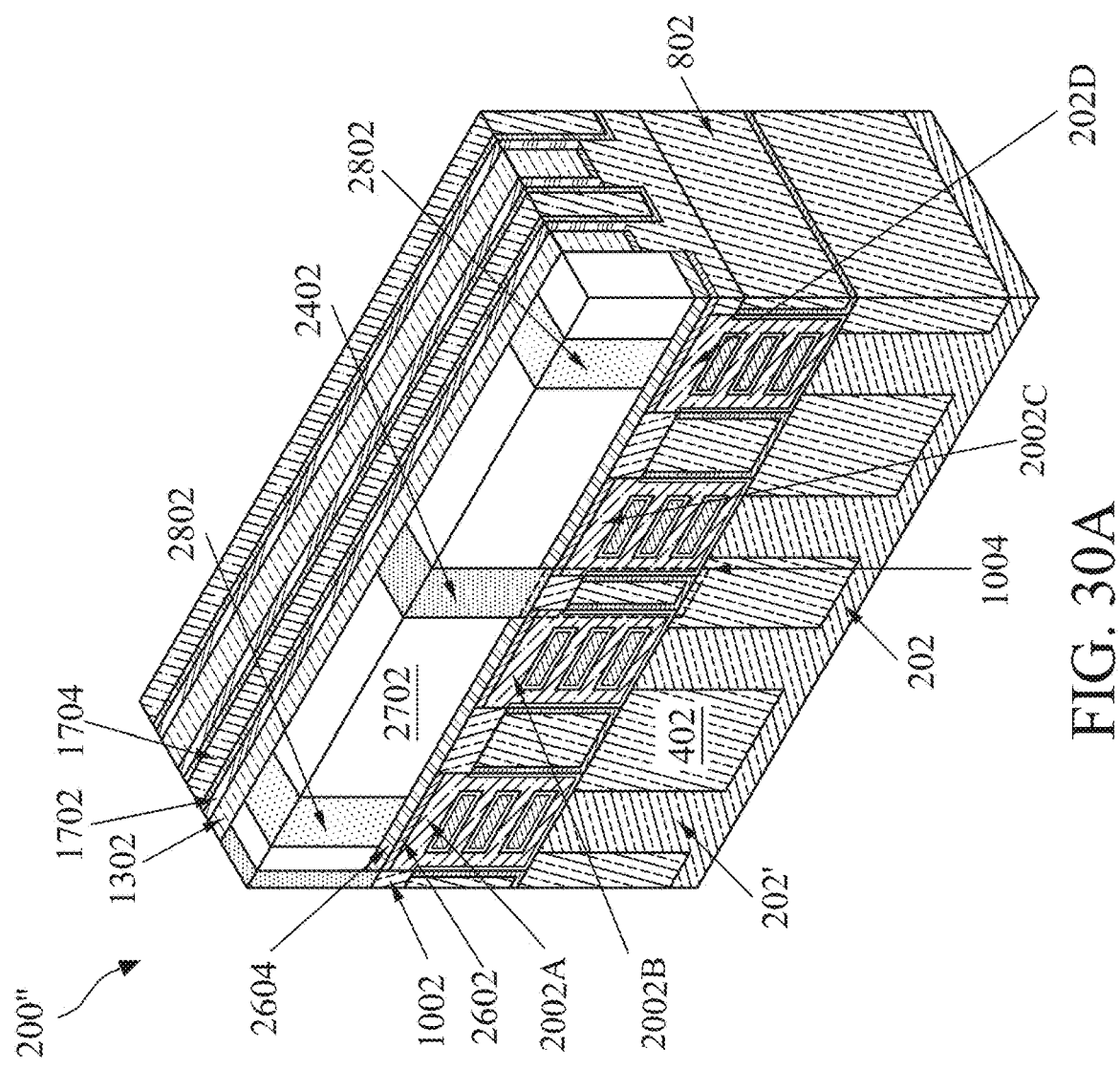
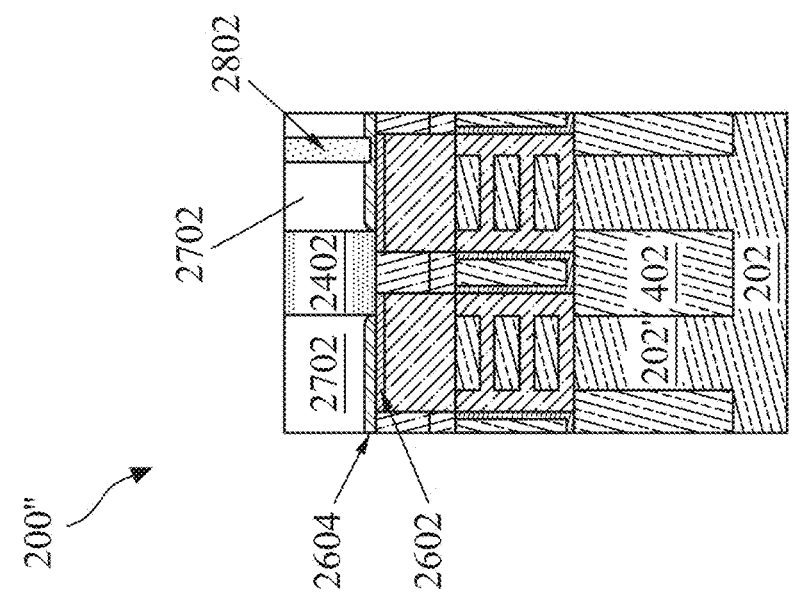
FIG. 30A
FIG. 30B

SELF-ALIGNED METAL GATE FOR MULTIGATE DEVICE AND METHOD OF FORMING THEREOF

CROSS-REFERENCE TO RELATED APPLICATIONS

This application is a divisional application of U.S. patent application Ser. No. 17/224,334, filed Apr. 7, 2021, and claims benefit of U.S. Provisional Patent Application Ser. No. 62/705,716 filed Jul. 13, 2020, the entire disclosures of which are incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology. Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. However, as GAA devices continue to scale, non-self-aligned gate cutting techniques typically implemented to isolate gates of different GAA devices from one another, such as a first gate of a first GAA transistor from a second gate of a second GAA transistor, are hindering the dense packing of IC features needed for advanced IC technology nodes. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3, 4, 5, 6, 7, 8, 9, 10, 11, 12, 13, 14, 15, 16, 17, 18, 19, 20A, 21A, 22A, 23A, 24A, 25A, 26A, 27A, and 28A are fragmentary perspective views of a multigate device, in portion or entirety, at various fabrication stages (such as those associated with the method in FIG. 1) according to various aspects of the present disclosure.

FIGS. 20B, 21B, 22B, 23B, 24B, 25B, 26B, 27B, and 28B are fragmentary cross-sectional views of a multigate device, in portion or entirety, at various fabrication stages (such as those associated with the method in FIG. 1) according to various aspects of the present disclosure.

FIGS. 30A and 30B are fragmentary perspective view and cross-sectional view of another embodiment of a third multigate device, in portion or entirety, which may be fabricated according to various aspects of the present disclosure.

DETAILED DESCRIPTION

Figure 1:
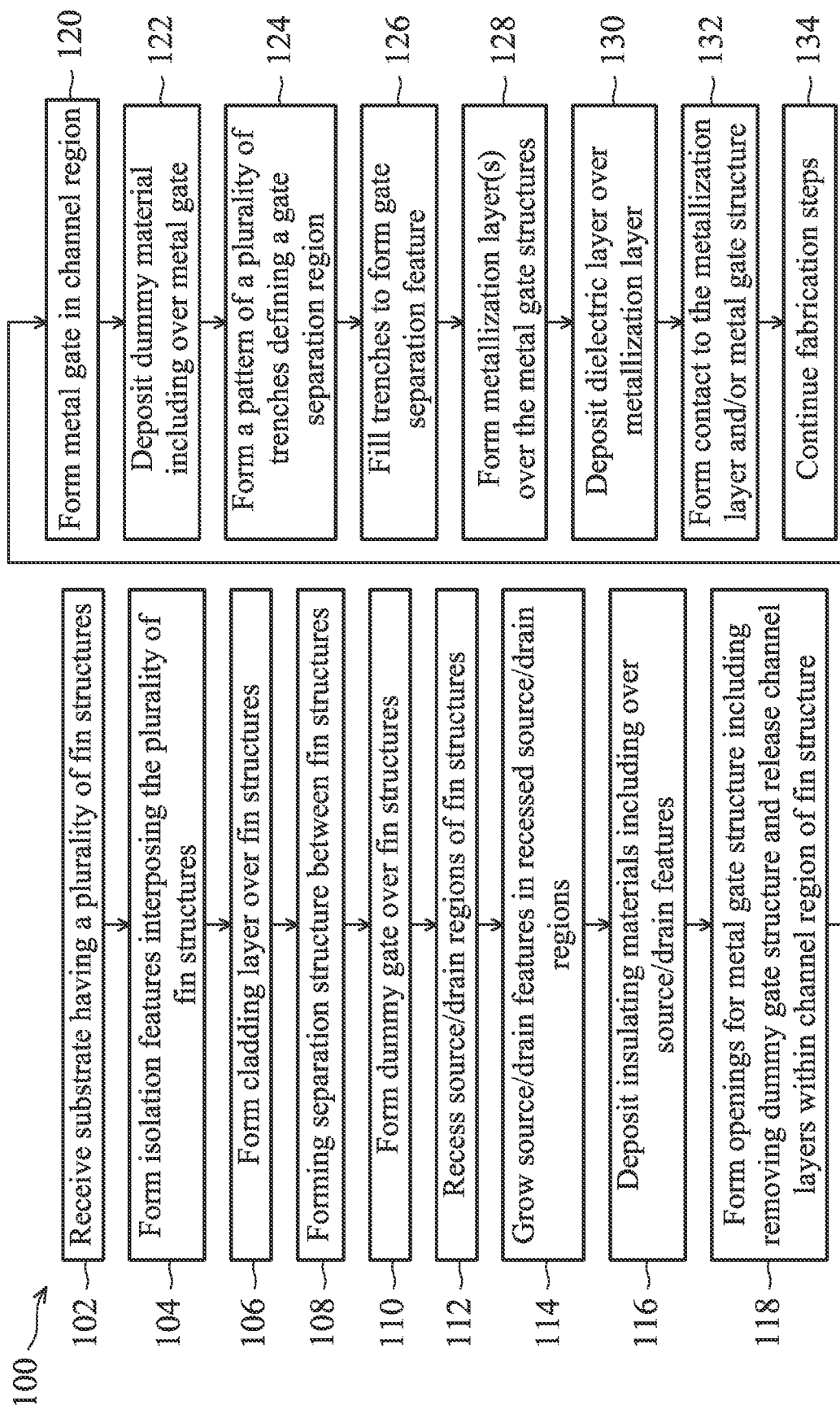
FIG. 1 is a flow chart of a method for fabricating a multigate device according to various aspects of the present disclosure.

The present disclosure relates generally to integrated circuit devices, and more particularly, to metal gate cutting technique for multigate devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In forming an integrated circuit, designs can provide for certain gate structures to be isolated from one another. To provide this isolation, processes sometimes termed gate cutting techniques, are used to provide a first gate structure over a first channel region separate and isolated from a second gate structure over a second channel region. A gate isolation feature or separation feature, for example being comprised of insulating layers, may be formed to provide electrical isolation between the first gate, which may be disposed over a first channel layer of a first GAA device (i.e., first active device area), and the second gate, which may be disposed over a second channel layer of a second GAA device (i.e., second active device area) and the respective electrical contacts to said gates. In other portions of the device however, the processes include providing a third gate structure electrically connected to another gate structure, such as the first gate structure.

Its recognized here that providing for processes, such as etching process, that can form the separation structure between adjacent gates without impact or damage to the gate itself is of importance. For example, undesired etching or loss of the gate in forming the separation structure can lead to undesiring lowering of gate height, which can be disadvantageous to the expected reliability and/or performance of the device. Methods and devices discussed herein provide for forming separation between gate structures, while connecting other gate structures, which in some implementations avoid loss of material from the gate structure. Avoiding the loss of gate structure material allows for implementation of a lower gate height in the device design, which can provide for improved AC performance of the device.

It is also recognized that in some implementations the present disclosure provides for devices and methods that provide for gate cutting, and certain gate connections, through self-aligned processes. The present disclosure thus provides for techniques for multigate devices that allows for smaller spacing between active device areas compared to spacing required between active device areas for non-self-aligned gate cutting techniques, which require additional spacing to account for misalignment of certain processes. Thus, in some implementations, the proposed self-aligned gate cutting technique allows for reduction of dimensions and such as metal gate dimensions, thereby increasing pattern density. Details of certain embodiments of proposed self-aligned gate separation (or cutting) technique for multigate devices and resulting multigate devices are described herein in the following pages. Similarly, details of certain embodiments of proposed technique form providing self-aligned gate electrical connection between gate structures for multigate devices and resulting multigate devices are described herein in the following pages.

Figure 29B:
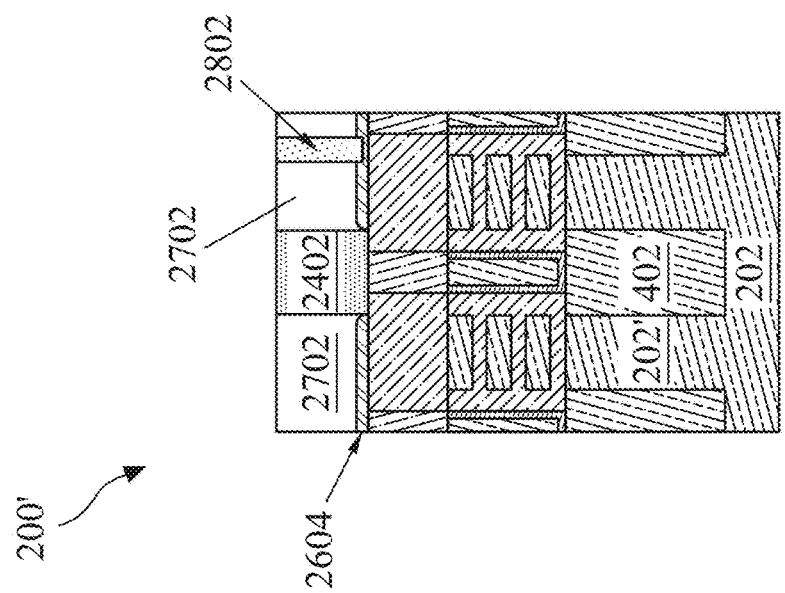
FIGS. 29A and 29B are fragmentary perspective view and cross-sectional view of another embodiment of a second multigate device, in portion or entirety, which may be fabricated according to various aspects of the present disclosure.
Figure 29A:
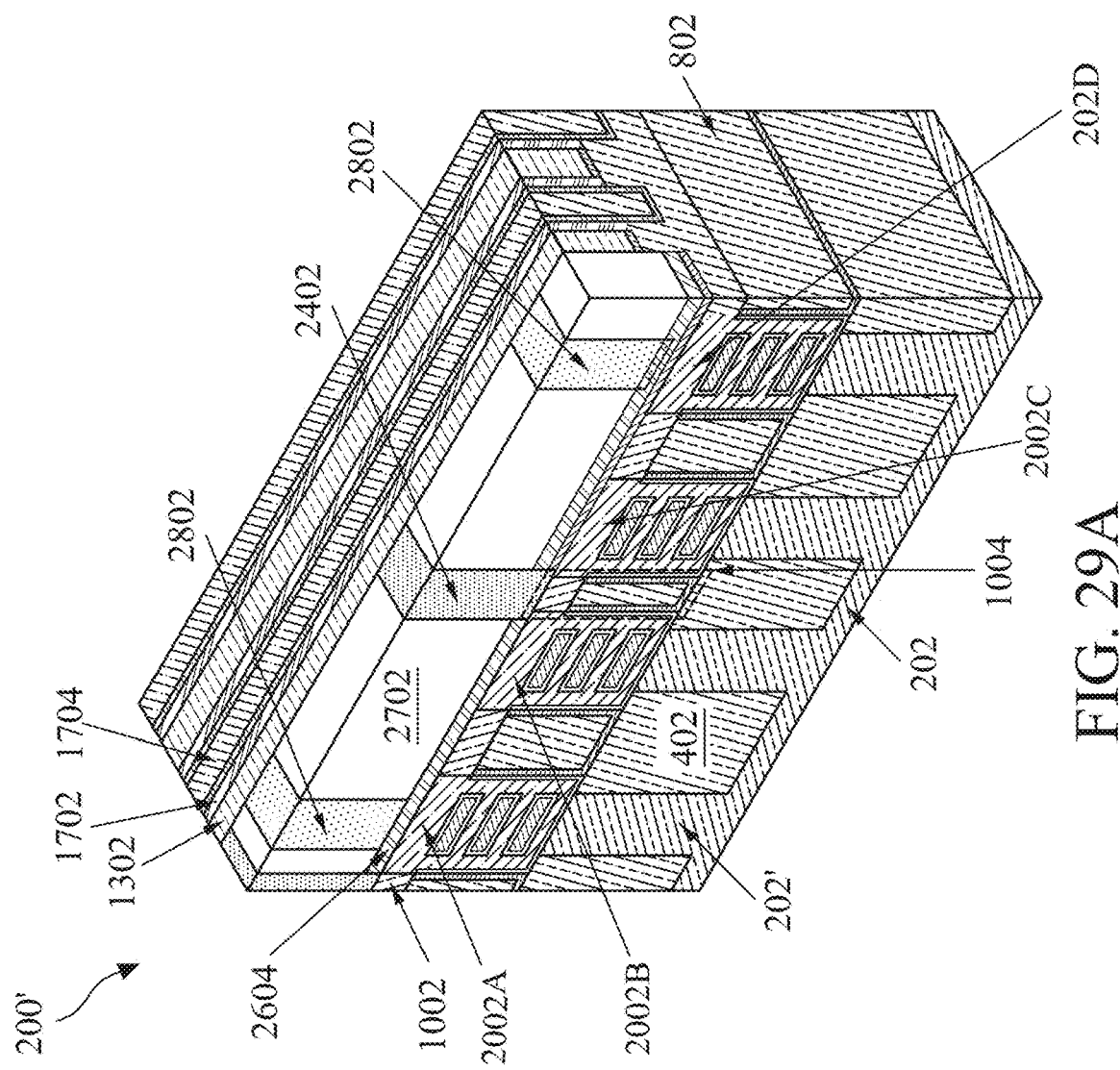

Referring now to FIG. 1, illustrated is a method 100 for fabricating a semiconductor device 200, a fragmentary cross-sectional view of which is illustrated in FIGS. 2-19, 20A, 21A, 22A, 23A, 24A, 25A, 26A, 27A, and 28A, and fragmentary cross-sectional views of which is illustrated in FIGS. 20B, 21B, 22B, 23B, 24B, 25B, 26B, 27B, 28B, and 32. Devices 200', 200" and 200''' are illustrated in aspects of the above referenced figures, in addition to FIGS. 29A/B, 30A/B, 31A/B respectively and are similarly exemplary devices that may be formed by aspects of the method 100. It is noted that the present examples of the device 200 include GAA devices, however, aspects of the present disclosure may also apply to other device types such as fin-type field effect transistors (FinFET).

Method 100 is exemplary only and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. Besides what are explicitly shown in figures of the present disclosure, the semiconductor device 200 may include additional transistors, bipolar junction transistors, resistors, capacitors, diodes, fuses, etc. Throughout the present disclosure, like reference numerals denote like features unless otherwise excepted or described. Outside of the specifically noted differences of exemplary devices 200, 200', 200", and 200''', a description of one of the devices applies to the other exemplary devices.

The method 100 begins at block 102 where a substrate is received having a plurality of fin structures formed thereon. Referring to the example of FIG. 2, a substrate 202 is provided. In an embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure. In some embodiments, the substrate 202 may include one or more well regions, such as n-type well regions doped with an n-type dopant (i.e., phosphorus (P) or arsenic (As)) or p-type well regions doped with a p-type dopant (i.e., boron (B)), for forming different types of devices. An ion implantation process, a diffusion process, and/or other suitable doping process can be performed to form the various doped regions.

Figure 2:
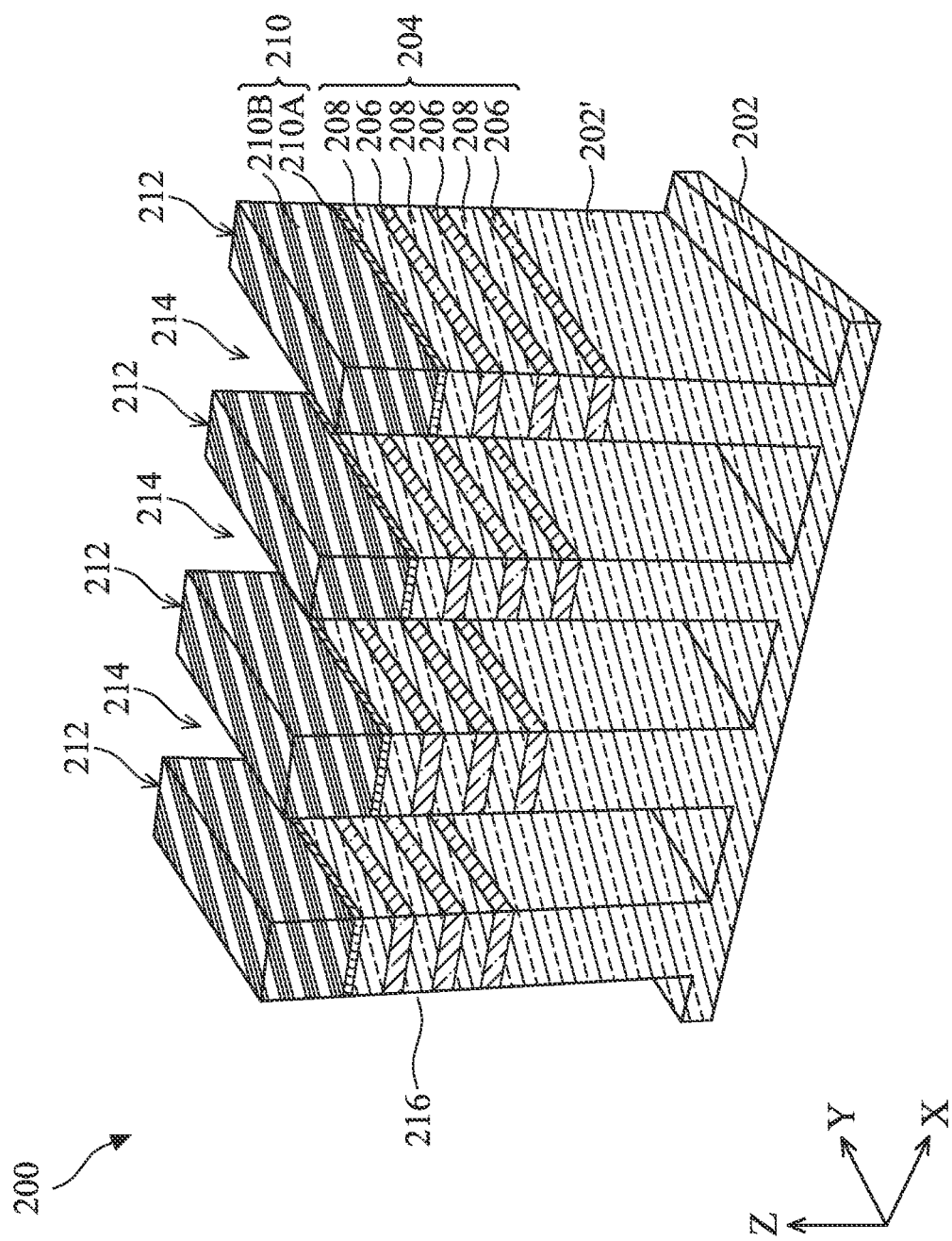

Referring still to FIG. 2, a stack 204 of epitaxial layers may be disposed on the substrate 202. The stack 204 may include a plurality of channel layers 208 interleaved by a plurality of sacrificial layers 206. The channel layers 208 and the sacrificial layers 206 may have different semiconductor compositions. The sacrificial layers 206 and the channel layers 208 are deposited alternatingly, one-after-another, to form the stack 204. In some implementations, the channel layers 208 are formed of silicon (Si) and sacrificial layers 206 are formed of silicon germanium (SiGe). In some implementations, the additional germanium content in the sacrificial layers 206 allow selective removal or recess of the sacrificial layers 206 without substantial damage to the channel layers 208, as discussed below. In some embodiments, the stack 204 including the sacrificial layers 206 and the channel layers 208 may be formed using an epitaxial process to deposit the materials. Exemplary techniques include but are not limited to CVD deposition techniques (e.g., vapor-phase epitaxy (VPE) and/or ultra-high vacuum CVD (UHV-CVD)), molecular beam epitaxy (MBE), and/or other suitable processes. It is noted that three (3) layers of the sacrificial layers 206 and three (3) layers of the channel layers 208 are alternately and vertically arranged as illustrated in FIG. 2. However, this is for illustrative purposes only and not intended to be limiting beyond what is specifically recited in the claims. The number of layers depends on the desired number of channels members for the semiconductor device 200. In some embodiments, the number of the channel layers 208 is between 2 and 10. For patterning purposes, a hard mask layer 210 may be disposed over the stack 204. The hard mask layer 210 may be a single layer or a multilayer. In one implementation, the hard mask layer 210 includes a silicon oxide layer 210A and a silicon nitride layer 210B.

The block 102 of the method 100 may include forming a plurality of fin structures extending above the substrate. Each of the fin structures defines an active region on the substrate. Referring to the example of FIG. 2, fin structures 212 are formed of the epitaxial stack 204. While two (2) or four (4) fin structures are shown in the exemplary figures, this is for illustrative purposes only and not intended to be limiting beyond what is specifically recited in the claims. The fin structures 212 may be fabricated using suitable processes including photolithography and etch processes. The photolithography process may include forming a photoresist layer overlying the substrate 202, exposing the photoresist layer to a pattern, performing post-exposure bake processes, and developing the photoresist layer to form a masking element including the photoresist layer. In some embodiments, the masking element further includes the hard mask layer 210, discussed above. In some embodiments, patterning the photoresist layer to form the masking element may be performed using an electron beam (e-beam) lithography process. The fin structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin structures. Thus, example processes include a patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof.

The masking element(s) described above may then be used to protect regions of the stack 204 and/or substrate 202 while the fin structures 212 are etched. Trenches 214 may be etched using a dry etch (e.g., chemical oxide removal), a wet etch, reactive ion etching (RIE), and/or other suitable processes. Numerous other embodiments of methods to form the fin structures 212 on the substrate 202 may also be used. The fin structures 212 extend vertically (Z-direction) above the substrate 202 and length-wise along the Y-direction from the substrate 202 and is spaced from the adjacent fin structure 212 in the X-direction. Each of the fin structures 212 includes a base portion formed from the substrate portion 202' and an overlying portion formed of materials of the stack 204.

Figure 3:
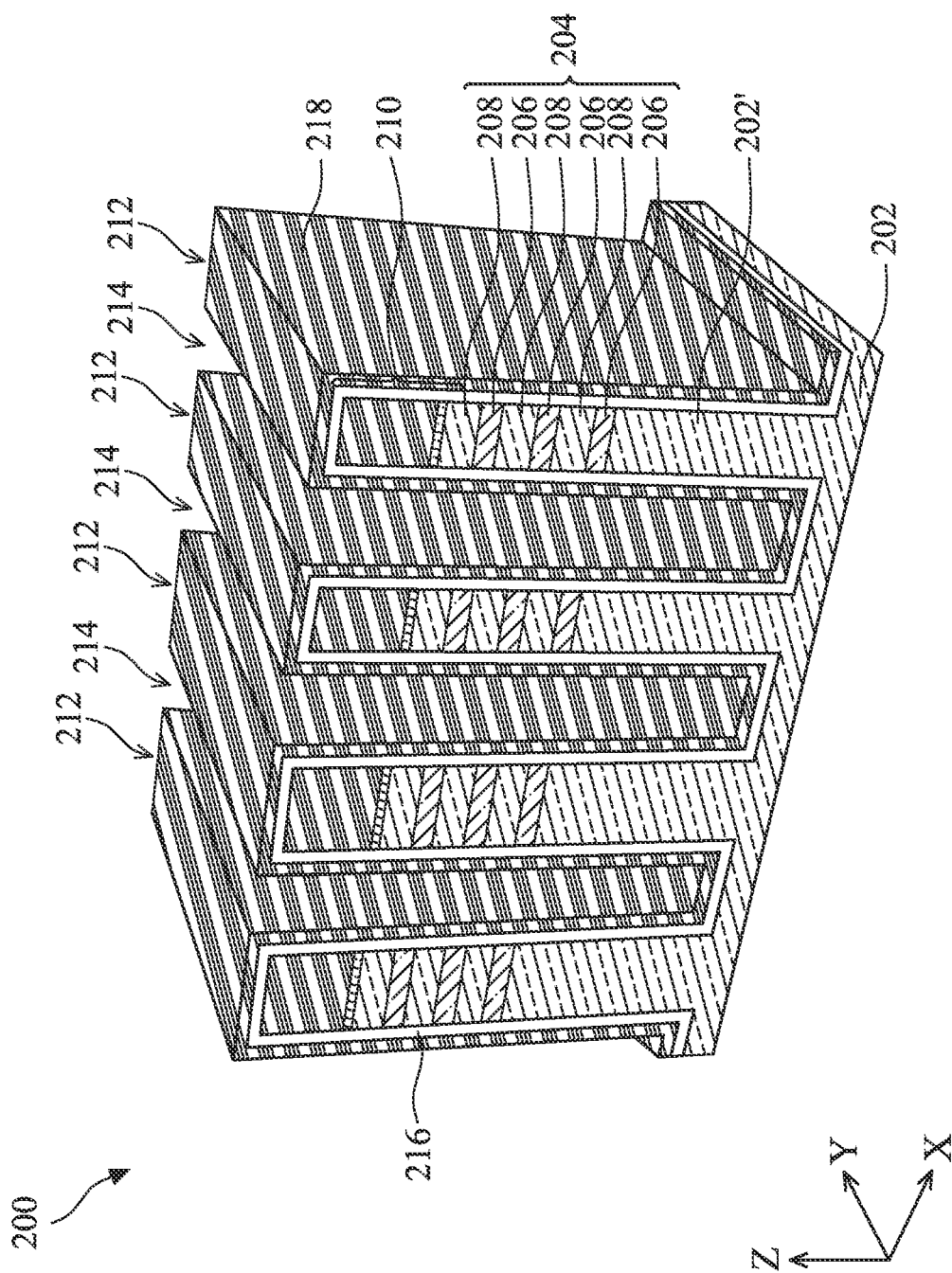

In some embodiments, block 102 of the method 100 includes forming a layer or layers on the etched fin structures. In some embodiments, an oxide liner layer (e.g., silicon oxide) is formed over the substrate and the fin structures. In some embodiments, a silicon liner layer is formed over the substrate and fin structures. Referring to FIG. 3, an oxide liner layer 216 and a silicon liner layer 218 are formed over the fin structures 212. In some embodiments, the oxide liner layer 216 and/or the silicon liner layer 218 are conformal layers, having substantially constant thickness. In some embodiments, silicon liner layer 218 and/or the oxide liner layer 216 is formed by chemical vapor deposition (CVD), physical vapor deposition (PVD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), sub-atmospheric vapor deposition (SAVCD), other suitable methods, or combinations thereof. In some embodiments, silicon liner layer 218 includes n-type dopants and/or p-type dopants.

The method 100 then proceeds to block 104 were isolation features are formed interposing the plurality of fin structures. The isolation features may be referred to as shallow trench isolation (STI) features. Referring to the example of FIG. 4, an isolation layer 402 is formed between the fin structures 212 and within the trenches 214. In an embodiment, the isolation material is multi-layer for example, including a liner layer and an overlying layer such as an oxide material. In some embodiments, oxide material is deposited by a flowable CVD (FCVD) process that includes, for example, depositing a flowable oxide material (for example, in a liquid state) over multigate device 200 and converting the flowable oxide material into a solid oxide material by an annealing process. The flowable oxide material can flow into trenches 214 and conform to exposed surfaces of multigate device 200, enabling in some implementations void free filling of trenches 214.

Figure 4:
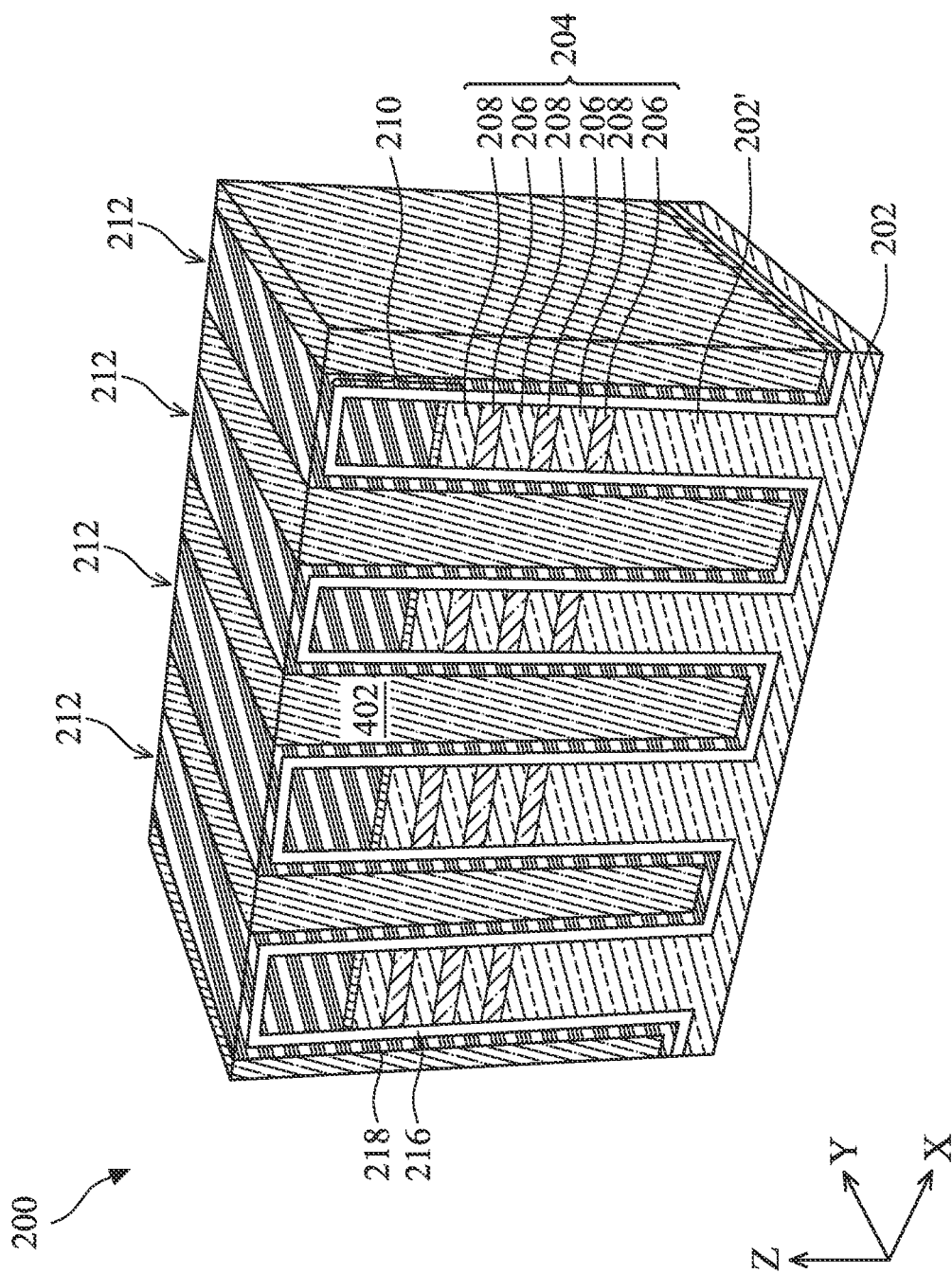

In some embodiments, the insulating material forming isolation layer 402 may include SiO2, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, or other suitable process. The deposition process can overfill trenches 214 (not shown) such that a thickness of the material for the isolation features 402 is greater than a height of fins 212. After the deposition process, the planarization process, such as a chemical mechanical polishing (CMP) process, is performed on the materials, thereby reducing the thickness. In some embodiments, the silicon liner layer 218 functions as an etch stop layer and the planarization stops exposing the silicon liner layer 218 over the fin structures 212. This planarization forms a surface such as illustrated in FIG. 4.

Figure 5:
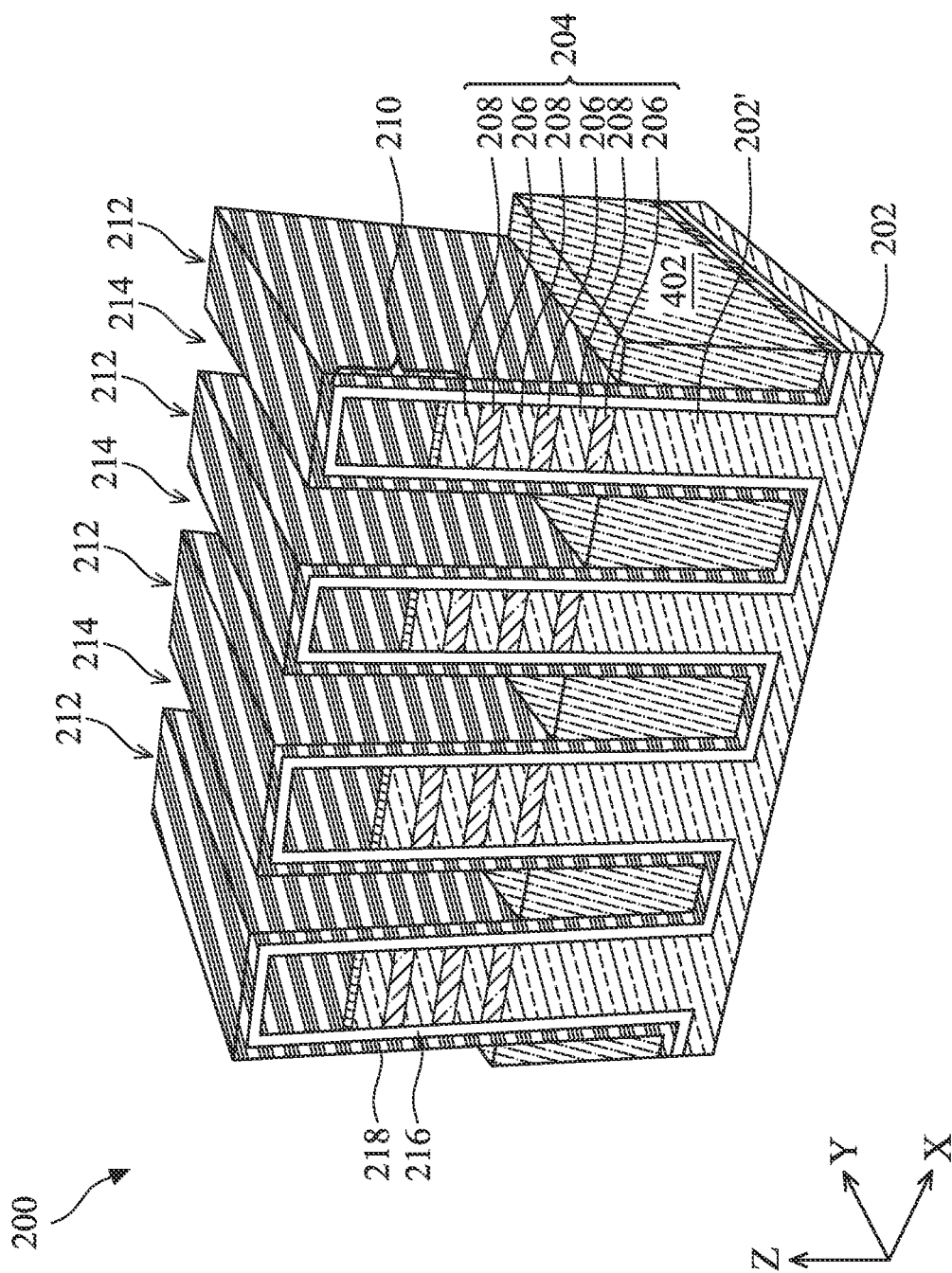
Figure 6:
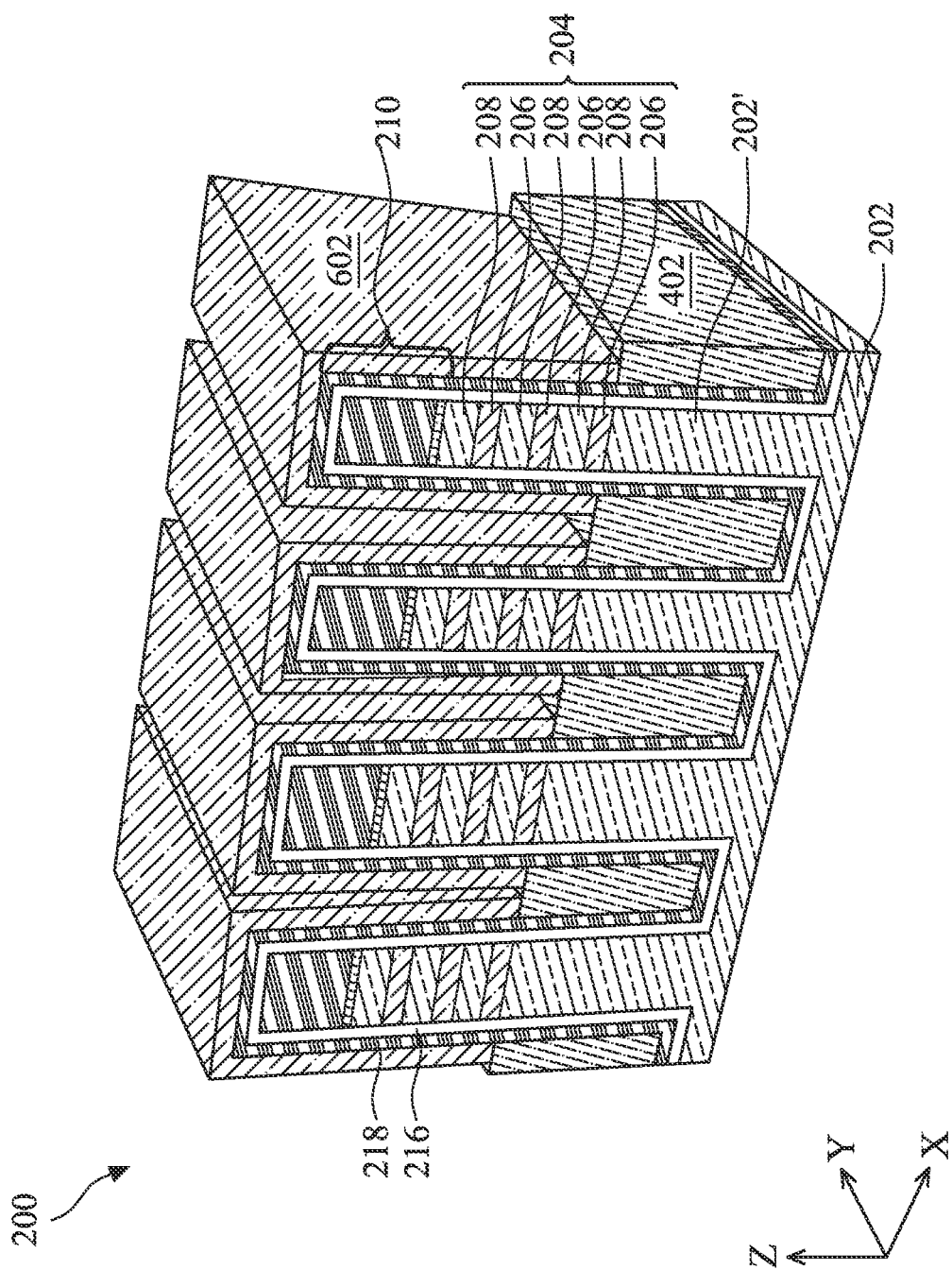
Figure 7:
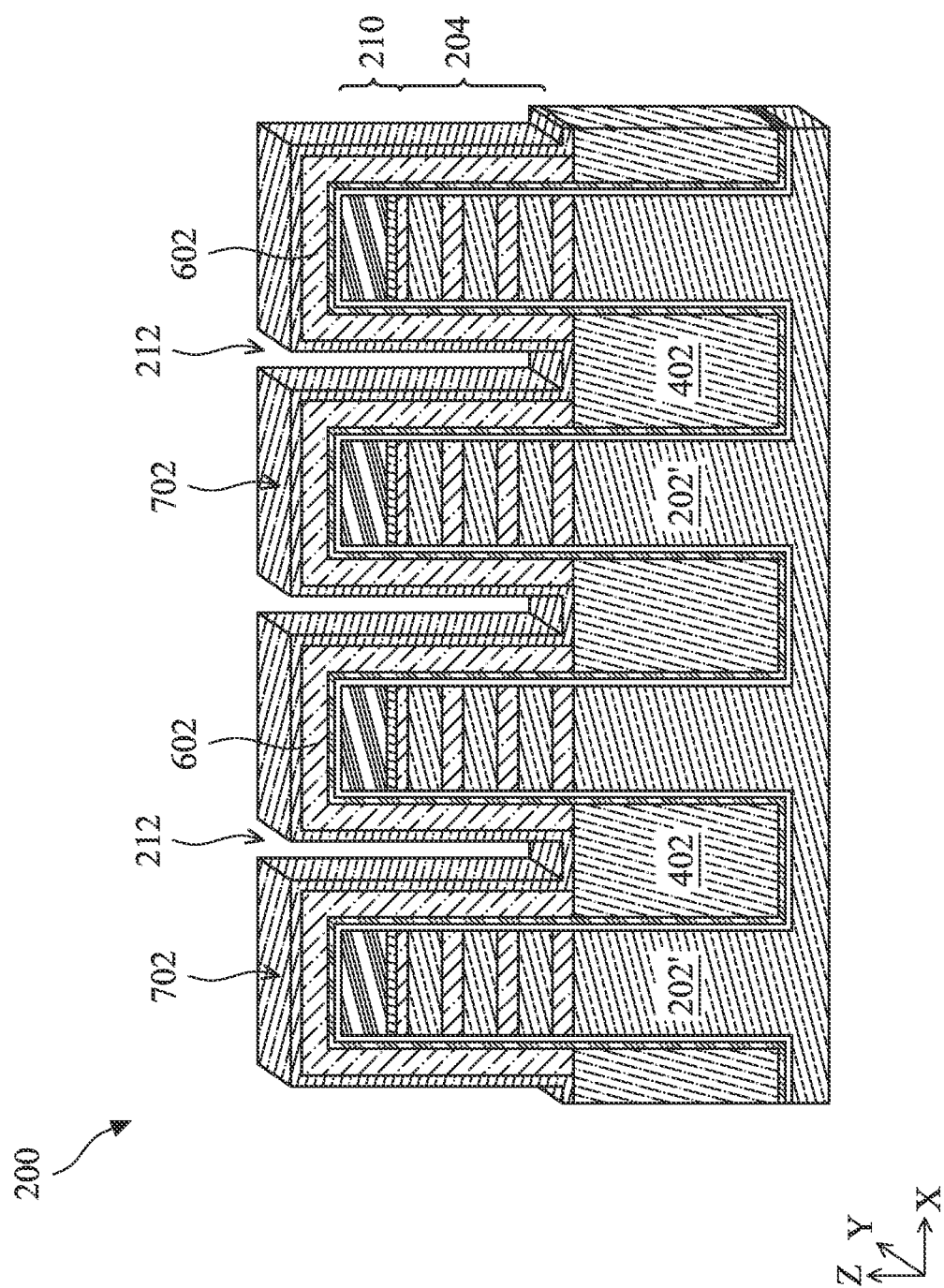

Turning to FIG. 5, the insulating material(s) may then be recessed, such that fin structures 212 extend (protrude) from between isolation features formed by the isolation layer 402. The etching process to recess the isolation material is configured to selectively remove material (e.g., oxide) with respect to silicon liner layer 218. For example, an etchant is selected for the etch process that etches silicon oxide (i.e., of isolation feature 402) at a higher rate than silicon (i.e., silicon liner layer 218). Thus, the isolation features 402 fill portions of the trenches 214 between the fin structure 212. In some embodiments, a field oxide, a LOCOS feature, and/or other suitable isolation features may additionally or alternatively be implemented on and/or within the substrate.

The method 100 then proceeds to block 106 where a cladding layer is formed over the fin structure. The cladding layer may be a sacrificial layer. The cladding layer may be formed over each fin structure. Referring to the example of FIG. 6, a cladding layer 602 is formed on each fin element 212. In some embodiments, the cladding layer 602 may have a composition similar to that of the sacrificial layers 206. In an embodiment, the cladding layer 602 is formed of silicon germanium (SiGe). In some implementations, the cladding layer 602 and the sacrificial layers 206 include a composition that allows selective removal of the sacrificial layers 206 and the cladding layer 602 during the release of channel layers 208 in a subsequent process by a single etchant, discussed below. In an embodiment, the cladding layer 602 may be epitaxially grown using vapor phase epitaxy (VPE), molecular bean epitaxy (MBE) or formed by a deposition process such as CVD process, a subatmospheric CVD (SACVD) process, a flowable CVD process, an ALD process, a PVD process, or other suitable process. After deposition, in some embodiments, operations at block 106 may include etch back processes to remove material of the cladding layer 602, for example conformally deposited, from on the isolation feature 402. In some implementations, block 106 may be omitted.

Figure 8:
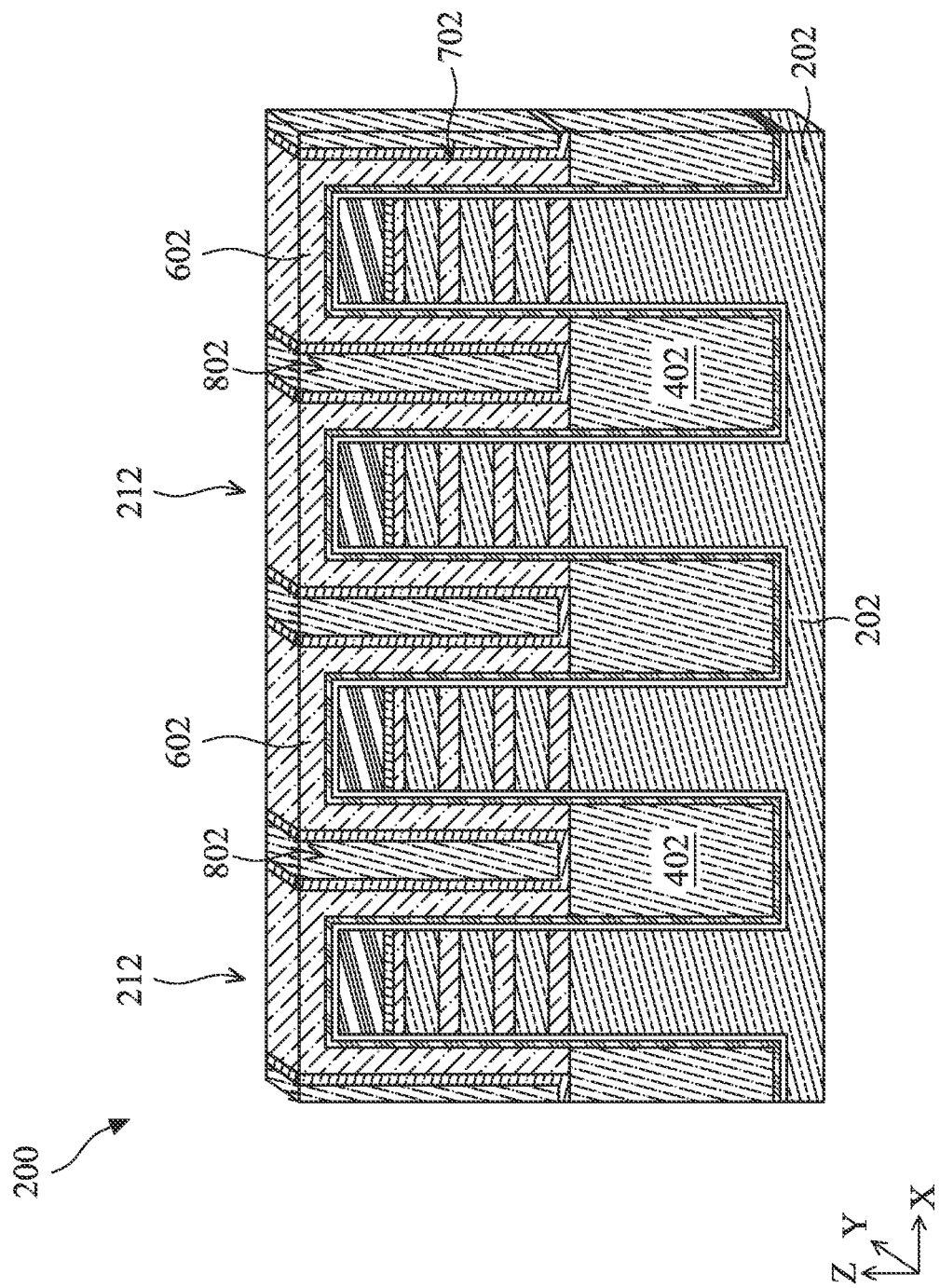

The method 100 then proceeds to block 108 where separation structures also referred to as dielectric fins, are formed between upper portions of the fin structures, thus separating the adjacent active regions. The separation structures may include a multi-layer structure filling the gap between fin structures and be disposed over the STI features of block 104. FIGS. 7-10 are illustrative of an embodiment of forming a multi-layer separation structure or dielectric fins between active regions. Referring first to the example of FIG. 7, a first dielectric layer 702 is deposited over the device 200. In an embodiment, the first dielectric layer is a high-k dielectric. In an embodiment, the first dielectric layer 702 may be silicon nitride silicon carbonitride (SiCN), silicon oxycarbonitride (SiOCN), or combinations thereof. In some embodiments, dielectric layer 702 includes $HfO_2$, HfSiO, $HfSiO_4$, HfSiON, HfLaO, HfTaO, HfSiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$, $(Ba,Sr)TiO_3$, $HfO_2$—$Al_2O_3$, other suitable high-k dielectric material, or combinations thereof. Following the first layer, referring to example of FIG. 8, an oxide layer 802 may then be formed over the first dielectric layer 702. In some embodiments, the oxide layer 802 may be deposited by a flowable CVD process, HARP, and/or other process providing suitable gap-filling properties. In some implementations, the trenches 214 may be overfilled with the oxide layer, and after deposition of the oxide layer 802, a CMP process may be performed providing a substantially planar top surface as illustrated in FIG. 8. In an embodiment, the cladding layer 602 provides an etch stop for this planarization process.

Figure 9:
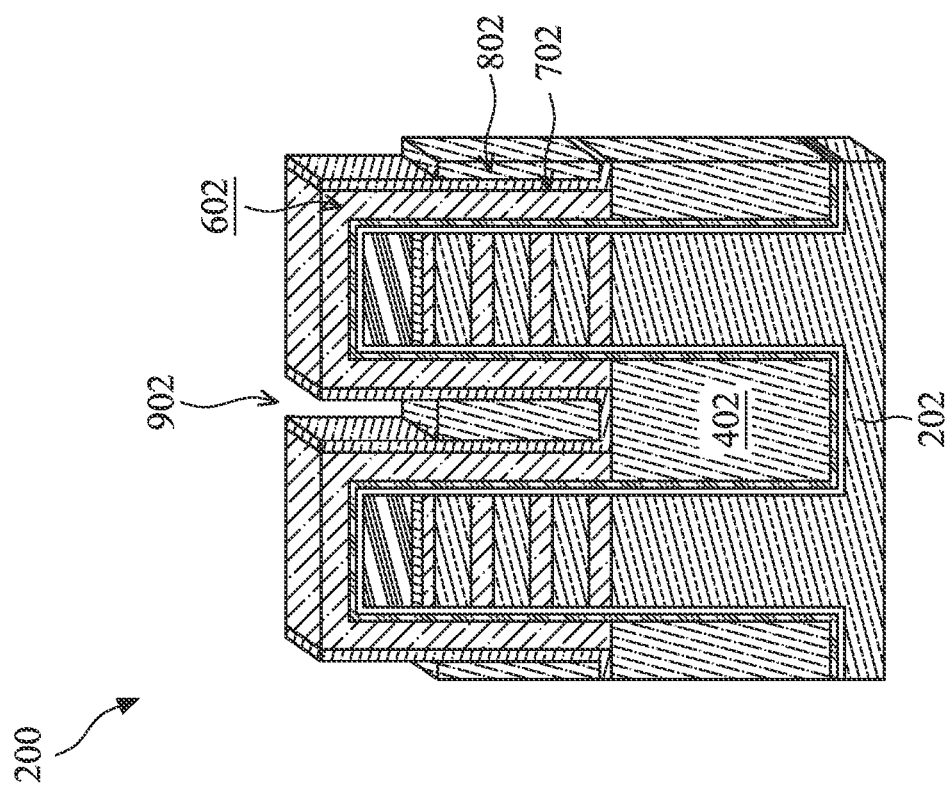

Referring to FIG. 9, the layers 702 and/or 802 are etched back forming an opening 902. In an embodiment, the oxide layer 802 is removed to form the opening 902, which has sidewalls defined by the first dielectric layer 702 and is confined with the trenches 214. The etching process to form the opening 902 may be a dry etching process, a wet etching process, or a combination thereof.

Figure 10:
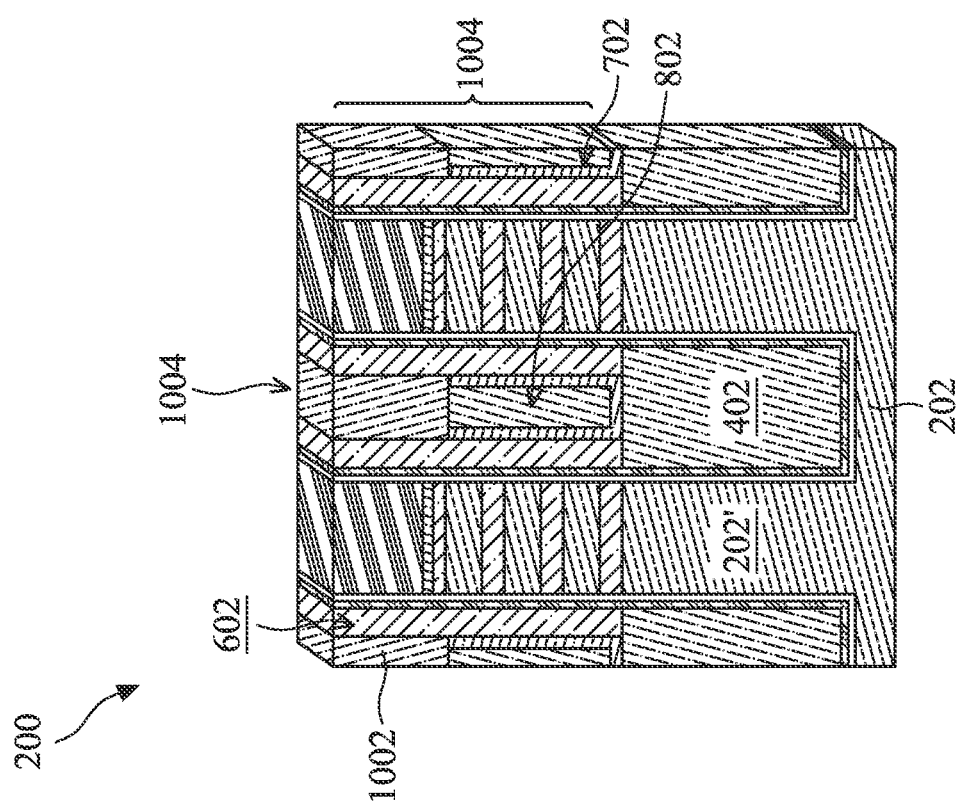

As illustrated in FIG. 10, dielectric material 1002 is formed within the opening 902. The dielectric material 1002 may be deposited such that it overflows the opening 902, and subsequently excess material be removed by a planarization process. In an embodiment, the dielectric material 1002 is a high-k dielectric. In some embodiments, the dielectric material 1002 is substantially the same composition as the first dielectric layer 702. In an embodiment, the dielectric material 1002 may be silicon nitride silicon carbonitride (SiCN), silicon oxycarbonitride (SiOCN), or combinations thereof. In some embodiments, dielectric layer 702 includes $HfO_2$, HfSiO, $HfSiO_4$, HfSiON, HfLaO, HfTaO, HfSiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$, $(Ba,Sr)TiO_3$, $HfO_2$—$Al_2O_3$, other suitable high-k dielectric material, or combinations thereof. The dielectric material 1002 may be deposited by suitable process such as a subatmospheric CVD (SACVD) process, a flowable CVD process, other CVD process, an ALD process, a PVD process, or other suitable process. In some implementations, subsequent to the deposition, planarization process is performed thereby thinning the deposited dielectric material 1002 to provide a planar top surface. In some implementations, the planarization process may stop at the hard mask 210.

The dielectric layers 702, 802, and 1002 discussed above together form the separation structure referred to as dielectric fin 1004. The dielectric fin 1004 extends between adjacent active regions, the fin structures 212, between cladding layer 602 portions. The dielectric fin 1004 is referred to as such, like the fin structures 212, the dielectric fin 1004 extend vertically (Z-direction) above the substrate 202 (in particular above the isolation structure 402) and length-wise along the Y-direction from the substrate 202 and are spaced from the adjacent dielectric fin 1004 in the X-direction.

Figure 11:
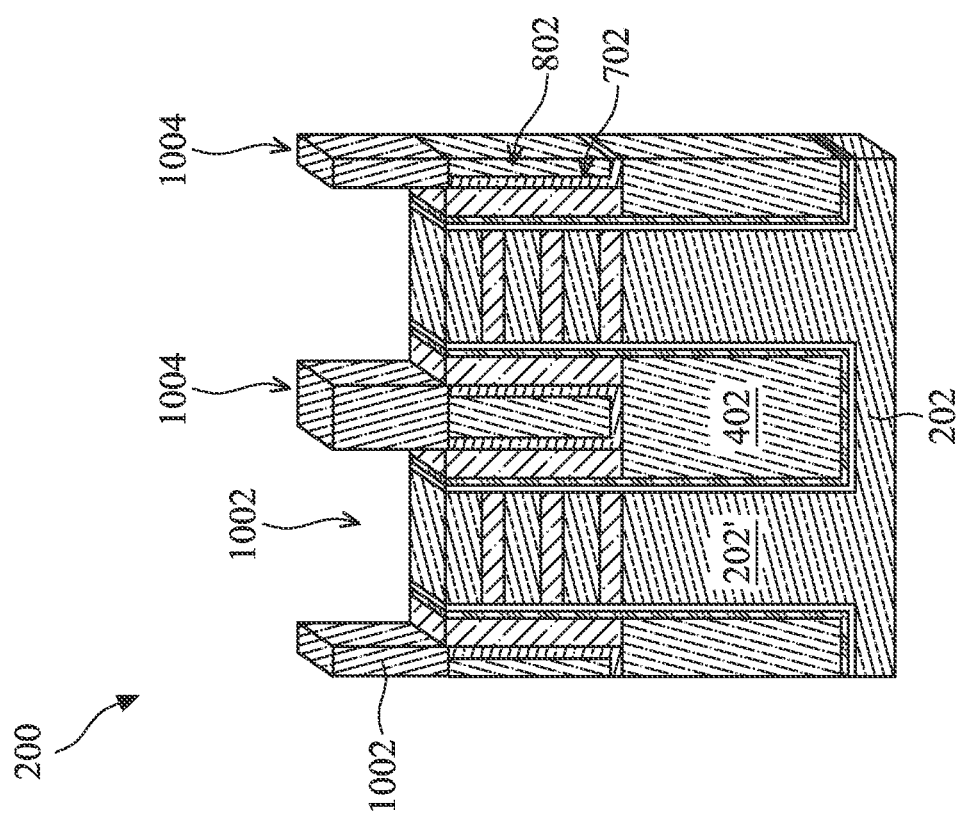

In some embodiments, after forming the separation structure or dielectric fin 1004 and prior to forming the dummy gate, the hard mask and adjacent cladding layers are etched to form an opening 1102 as illustrated FIG. 11. In some embodiments, the etching exposes an upper surface of a channel region on which the gate structure can be formed as discussed below.

Figure 12:
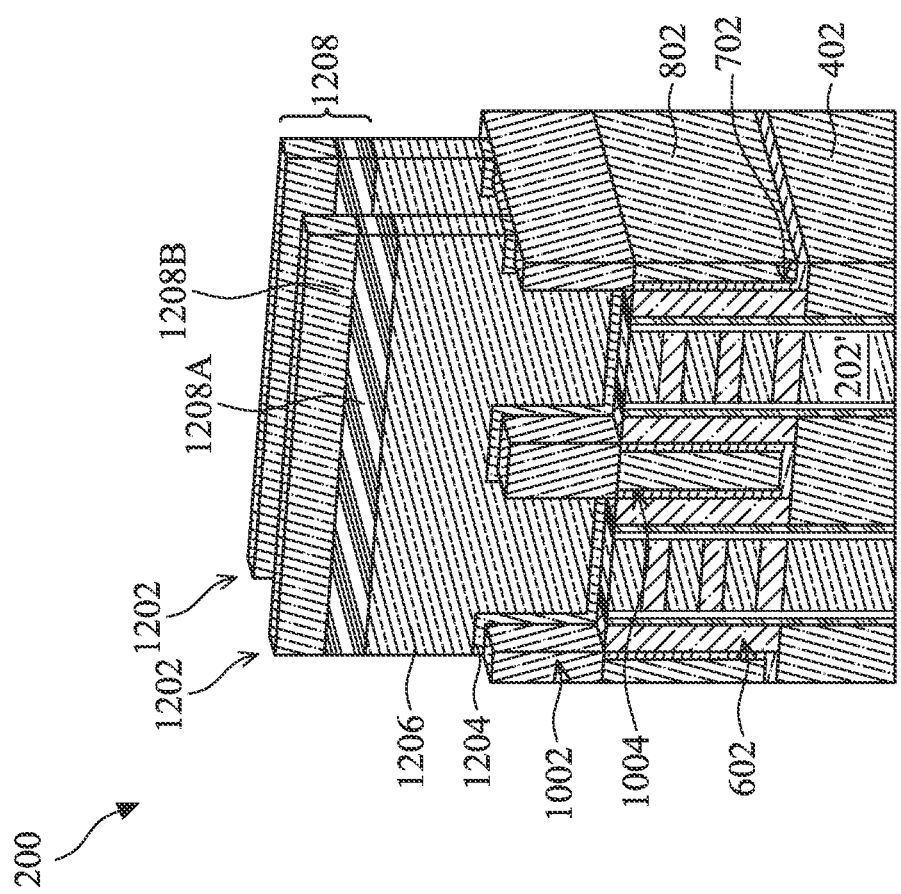

The method 100 then proceeds to block 110 where a dummy gate is formed over the fin structures. Referring to FIG. 12, dummy gate structures 1202 are formed over portions of fins 212 and dielectric fins 1004. Dummy gate structures 1202 fill portions of openings 1102 and can extend over dielectric fins 1004. Dummy gate structures 1202 extend lengthwise in a direction that is different than (e.g., orthogonal to) the lengthwise direction of fin structures 212. For example, dummy gate structures 1202 extend substantially parallel to one another along the x-direction, having a length defined in the x-direction, a width defined in the y-direction, and a height defined in the z-direction. Dummy gate structures 1202 are disposed over channel regions of multigate device 200 and between source/drain regions (S/D) of multigate device 200, which are exposed by a remainder of openings 1102. Each dummy gate structure 1202 includes a dummy gate dielectric 1204, a dummy gate electrode 1206, and a hard mask 1208 (including, for example, a first mask layer 1208A and a second mask layer 1208B, in some implementations a pad oxide 1208A and a pad nitride 1208B). Dummy gate dielectric 1204 includes a dielectric material, such as silicon oxide, a high-k dielectric material, other suitable dielectric material, or combinations thereof. In some embodiments, dummy gate dielectric 1204 includes an interfacial layer (including, for example, silicon oxide) and a high-k dielectric layer disposed over the interfacial layer. Dummy gate electrode 1206 includes a suitable dummy gate material, such as polysilicon. In some embodiments, dummy gate structures 1202 include numerous other layers, for example, capping layers, interface layers, diffusion layers, barrier layers, or combinations thereof. Dummy gate structures 1202 are formed by deposition processes, lithography processes, etching processes, other suitable processes, or combinations thereof. For example, a first deposition process is performed to form a dummy gate dielectric layer over multigate device 200, a second deposition process is performed to form a dummy gate electrode layer over the dummy gate dielectric layer, and a third deposition process is performed to form a hard mask layer over the dummy gate electrode layer. In one implementation, the hard mask layer 1208 includes a silicon oxide layer 1208A and a silicon nitride layer 1208B. The deposition processes include CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern the hard mask layer, the dummy gate electrode layer, and the dummy gate dielectric layer to form dummy gate structures 1202, which include dummy gate dielectric 1204, dummy gate electrode 1206, and hard mask 1208 as depicted in FIG. 12. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Figure 13:
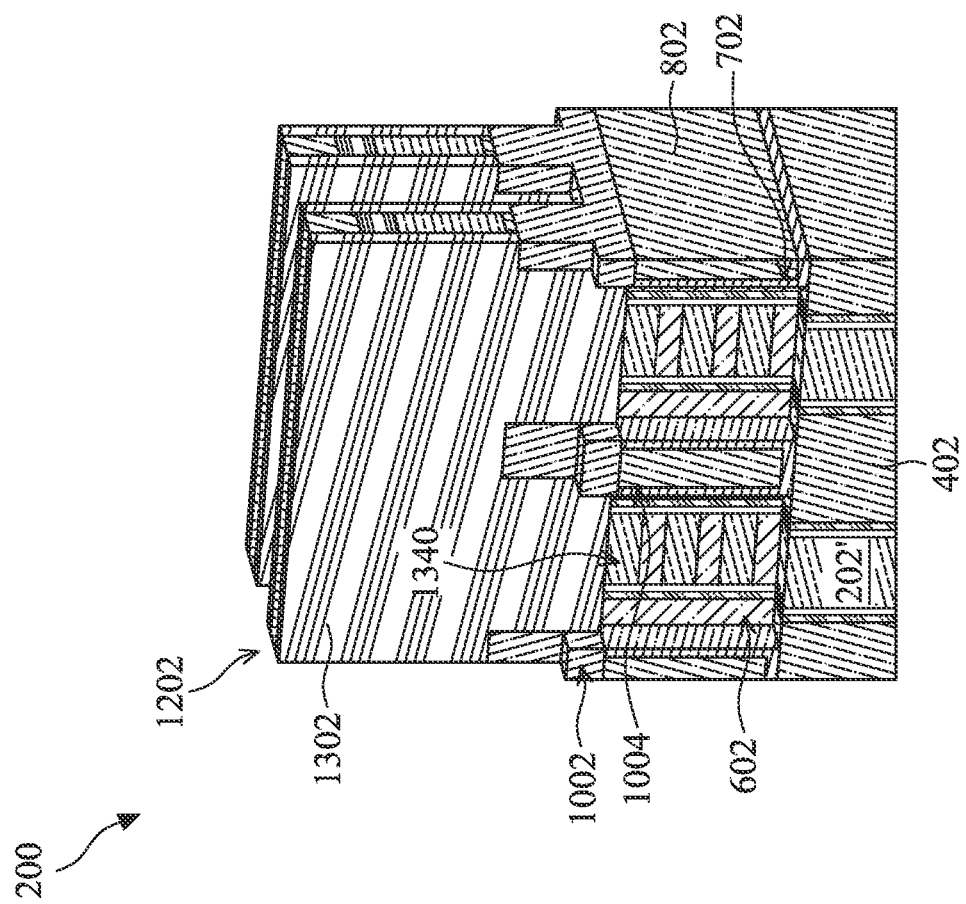

Turning to FIG. 13, the dummy gate structures 1202 may further include gate spacers 1302 formed along sidewalls of dummy gate stacks 1202. The gate spacers 1302 may be comprised of suitable dielectric material. The dielectric material can include silicon, oxygen, carbon, nitrogen, other suitable material, or combinations thereof (e.g., silicon oxide, silicon nitride, silicon oxynitride, silicon carbide, silicon carbon nitride, silicon oxycarbide, and/or silicon oxycarbonitride). In some embodiments, gate spacers 1302 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate structures 1202.

The method 100 then proceeds to block 112 where the source/drain regions of the fin structures adjacent the dummy gate structure are recessed. In FIG. 13, portions of fin structures 212 in source/drain regions of multigate device 200 (i.e., source/drain regions of fin structures 212 that are not covered by gate structures 1202) are also at least partially removed to form source/drain recesses or trenches 1304. In the depicted embodiment, an etching process completely removes semiconductor layer stacks 204 in source/drain regions of multigate device 200, thereby exposing fin portions 202' in source/drain regions. In embodiments, the etching process also completely removes portions of cladding layer 602 in source/drain regions. In the depicted embodiment, each source/drain recess 1304 thus has a sidewall defined by a respective one of dielectric fins 1004 and a bottom defined by a respective fin portion 202' and respective isolation feature 402. The etching process can include a dry etching process, a wet etching process, other suitable etching process, or combinations thereof. In some embodiments, the etching process is a multi-step etch process.

Figure 14:
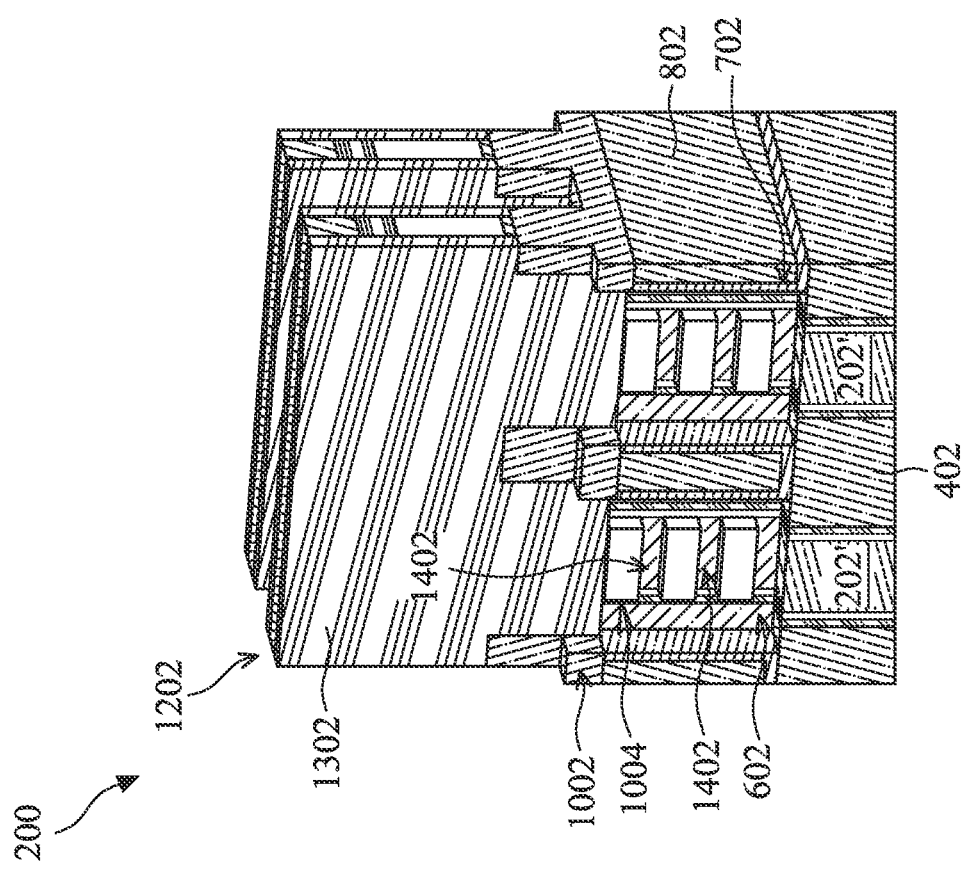
Figure 15:
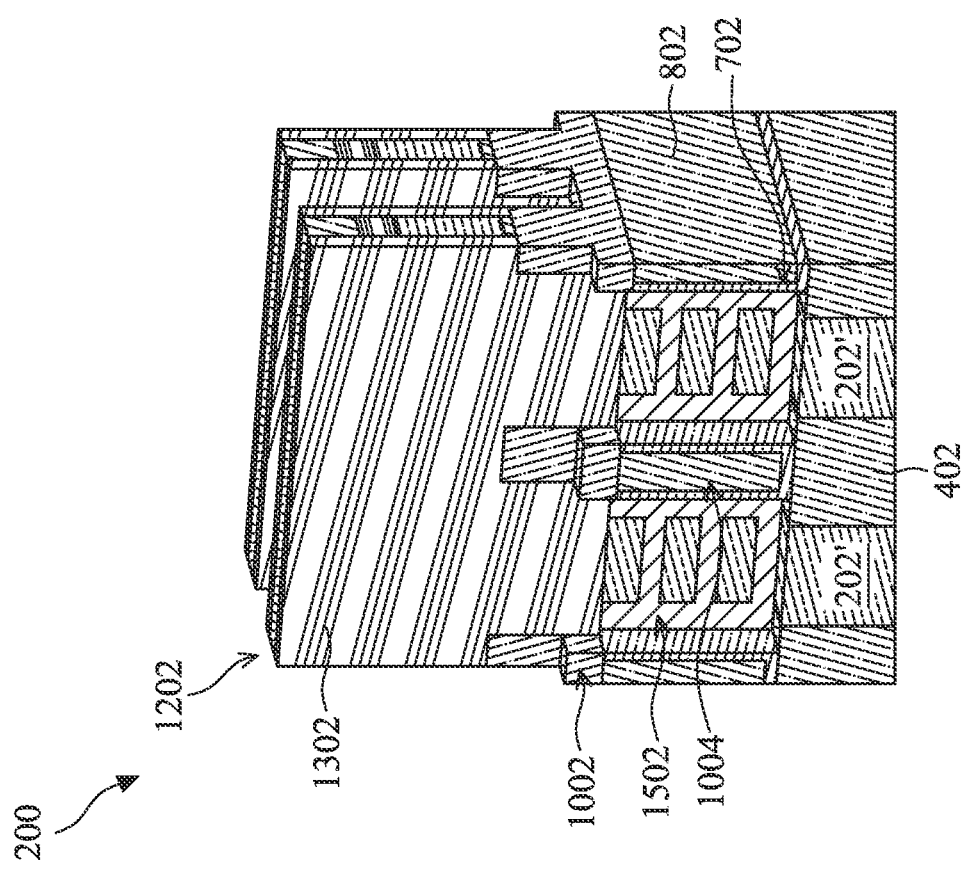

Referring to FIGS. 14 and 15, in some embodiments, block 112 further includes slightly (laterally) etching sacrificial layers 206 to form an opening 1402 (e.g., under the gate structure 1202 including gate spacers 1302). The openings 1402 are formed between suspended end regions of the channel layers 208. Inner spacers 1502 may be formed within the opening 1402. In some embodiments, the inner spacer includes a dielectric material that includes silicon, oxygen, carbon, nitrogen, other suitable material, or combinations thereof (for example, silicon oxide, silicon nitride, silicon oxynitride, silicon carbide, and/or silicon oxycarbonitride). In some embodiments, the inner spacers 1502 includes a low-k dielectric material, such as those described herein.

Figure 16:
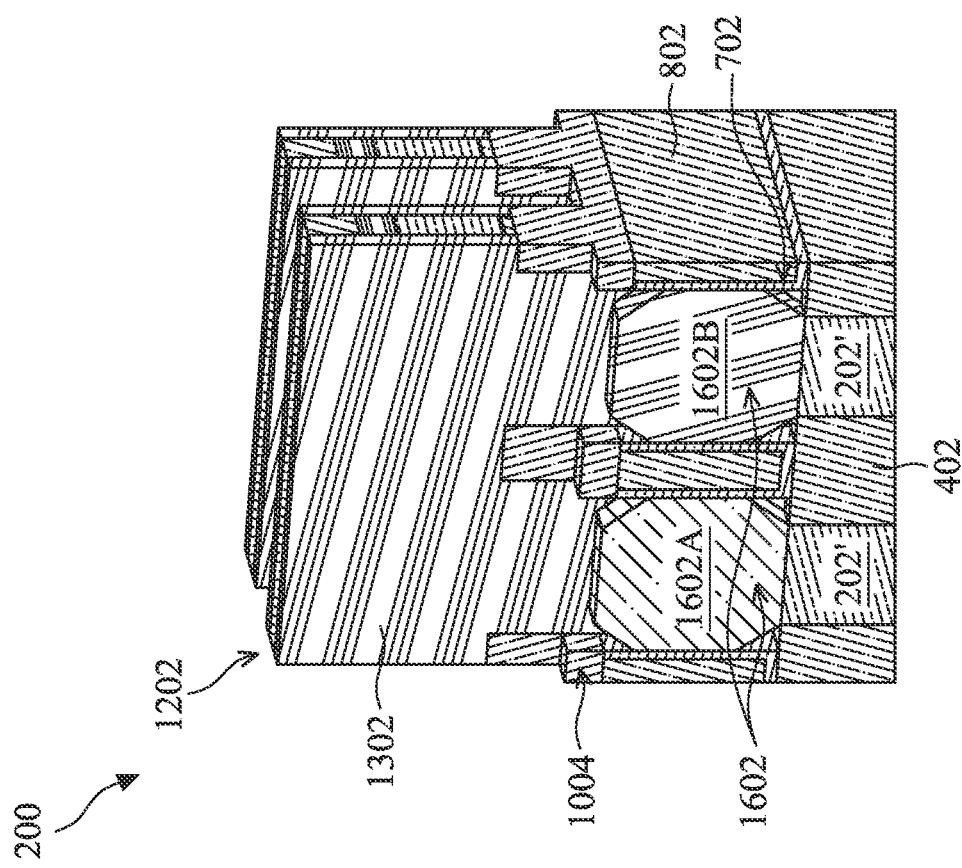
Figure 17:
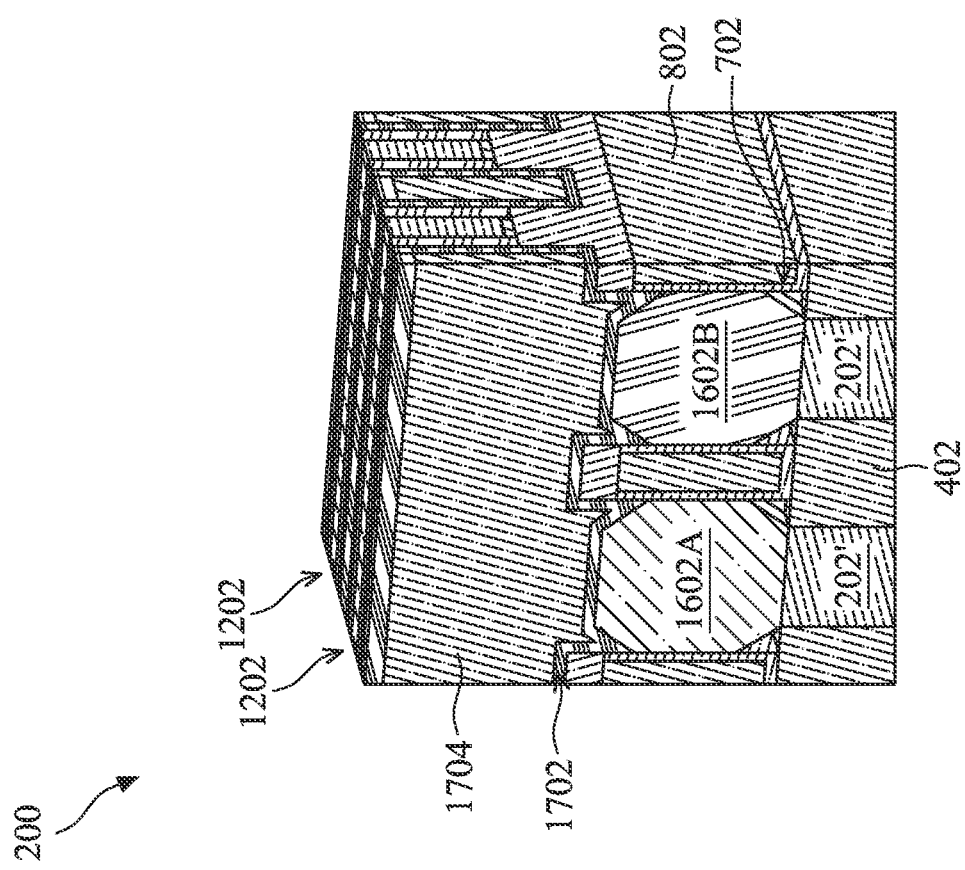

The method 100 then proceeds to block 114 where source/drain features are grown in the recessed source/drain regions of the fin structures. Referring to FIG. 16, epitaxial source/drain features 1602, denoted 1602A and 1602B, are formed in source/drain recesses 1304. In some implementations, a semiconductor material is epitaxially grown from a seed area including the exposed surface of fin portions 202' of substrate 202, forming epitaxial source/drain features 1602A in source/drain recesses 1304 that correspond with a first type of transistor such as a n-type transistor and epitaxial source/drain features 1602B in source/drain recesses 1304 that correspond with a second type of transistor such as, a p-type transistor. In some implementations, epitaxy process to form the source/drain features 1602 can use CVD deposition techniques (for example, LPCVD, VPE, and/or UHV-CVD), molecular beam epitaxy, other suitable epitaxial growth processes, or combinations thereof. The epitaxy process can use gaseous and/or liquid precursors, which interact with the composition of seed area(s). Epitaxial source/drain features 1602 are doped with n-type dopants and/or p-type dopants respectively. In some embodiments, for the n-type transistors, epitaxial source/drain features 1602A include silicon, which can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type transistors, epitaxial source/drain features 1602B include silicon germanium or germanium, which can be doped with boron, other p-type dopant, or combinations thereof (for example, forming Si:Ge:B epitaxial source/drain features). In some embodiments, epitaxial source/drain features 1602 include more than one epitaxial semiconductor layer, where the epitaxial semiconductor layers can include the same or different materials and/or dopant concentrations. In some embodiments, epitaxial source/drain features 1602 are doped during deposition by adding impurities to a source material of the epitaxy process (i.e., in-situ). In some embodiments, epitaxial source/drain features 1602 are doped by an ion implantation process subsequent to a growth process. In some embodiments, epitaxial source/drain features 1602A is formed in separate processing sequences from epitaxial source/drain features 1602B when forming epitaxial source/drain features of different device types.

The method 100 then proceeds to block 116 where insulating materials are formed on the substrate including over the source/drain features. The insulating materials formed may be materials through which a subsequent contact element to the source/drain features are formed. The insulating materials providing isolation between the source/drain contact and, for example, the adjacent gate structure. The insulating materials may be referred to as a contact etch stop layer (CESL) and an interlayer dielectric (ILD) layer. The CESL may be used as an etch stop in forming contact elements to the source/drain features (not shown). Referring to the example of FIG. 17, deposition process(es) (such as CVD, PVD, ALD, HDPCVD, MOCVD, RPCVD, PECVD, LPCVD, ALCVD, APCVD, FCVD, HARP, HDP, other suitable methods, or combinations thereof) are performed to form dielectric layers 1702 and 1704 on the device 200. In an embodiment, dielectric layer 1704 is an inter-level dielectric (ILD) layer and dielectric layer 1702 is a bottom contact etch stop layer (B-CESL). Dielectric layer 1704 may include a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, dielectric layer 1704 includes a dielectric material having a dielectric constant that is less than a dielectric constant of silicon dioxide (e.g., k<3.9). In some embodiments, dielectric layer 1704 includes a dielectric material having a dielectric constant that is less than about 2.5 (i.e., an extreme low-k (ELK) dielectric material), such as silicon dioxide ($SiO_2$) (for example, porous silicon dioxide), silicon carbide (SiC), and/or carbon-doped oxide (for example, a SiCOH-based material (having, for example, Si—$CH_3$ bonds)), each of which is tuned/configured to exhibit a dielectric constant less than about 2.5. Dielectric layer 1702 includes a material different than dielectric layer 1704. Exemplary compositions of the dielectric layer 1702 include but are not limited to silicon nitride or silicon oxynitride.

In some implementations, a CMP process and/or other planarization process is performed after deposition until exposing a top portions of dummy gate structures 1202. In some embodiments, the planarization process removes hard mask layers 1208 of dummy gate structures 1202 to expose underlying dummy gate electrodes 1206 (e.g., polysilicon).

The method 100 then proceeds to block 118 where openings for a metal gate structure are formed including by removing dummy gate structure and releasing the channel layers within channel region of fin structure. In an embodiment of the block 118, the dummy gate structure of block 110 is removed. Referring to the example of FIG. 18, the dummy gate structure 1202 is removed to form opening 1802 as shown in FIG. 18. It is noted that FIG. 18, like the following figures, provides a perspective view with a cut through the channel region, offset from the source/drain features 1602, e.g., FIG. 17, which are therefore not visible. In some embodiments, such as depicted, the etching process does not remove dummy gate dielectric 1204 when removing the gate electrode 1206. In some embodiments, the etching process or a subsequent etching process partially or completely removes dummy gate dielectric 1204. The etching process(es) may be a dry etching process, a wet etching process, or a combination thereof.

Referring to the example of FIG. 19, a channel release process may result in the removal of the sacrificial layers 206 in the channel region, thereby forming suspended semiconductor layers 208 in the channel region, which are separated from one another and/or fin portions 202' by gaps. The etching process releasing the channel layers 208 is a dry etching process, a wet etching process, or a combination thereof. The channel release process may further include removing the cladding layer 602 in the channel region. The channel release process may include an etching process selective to a composition (e.g., silicon germanium) of the cladding layer 602 and/or the sacrificial layers 206, while providing no to minimal etching of the channel layers 208.

The release of the channel layers, the dummy gate structure removal, and the cladding layer 602 removal provide respective openings 1902 in the channel regions of the device 200 as illustrated in FIG. 19.

In some implementations, the dielectric fin 1004 is not removed between adjacent channel regions of a different type of device (e.g., n-type or p-type) thus, continuing to provide isolation between adjacent devices of different types. In some embodiments, the dielectric fin 1004 is also not removed between adjacent channel regions of a same device type (e.g., n-type or p-type) and any interconnection of the gate structure for those devices may be provided not by the gate electrode structure itself, but by metallization formed over the dielectric fin 1004 as discussed below.

Figures 20A, 20B:
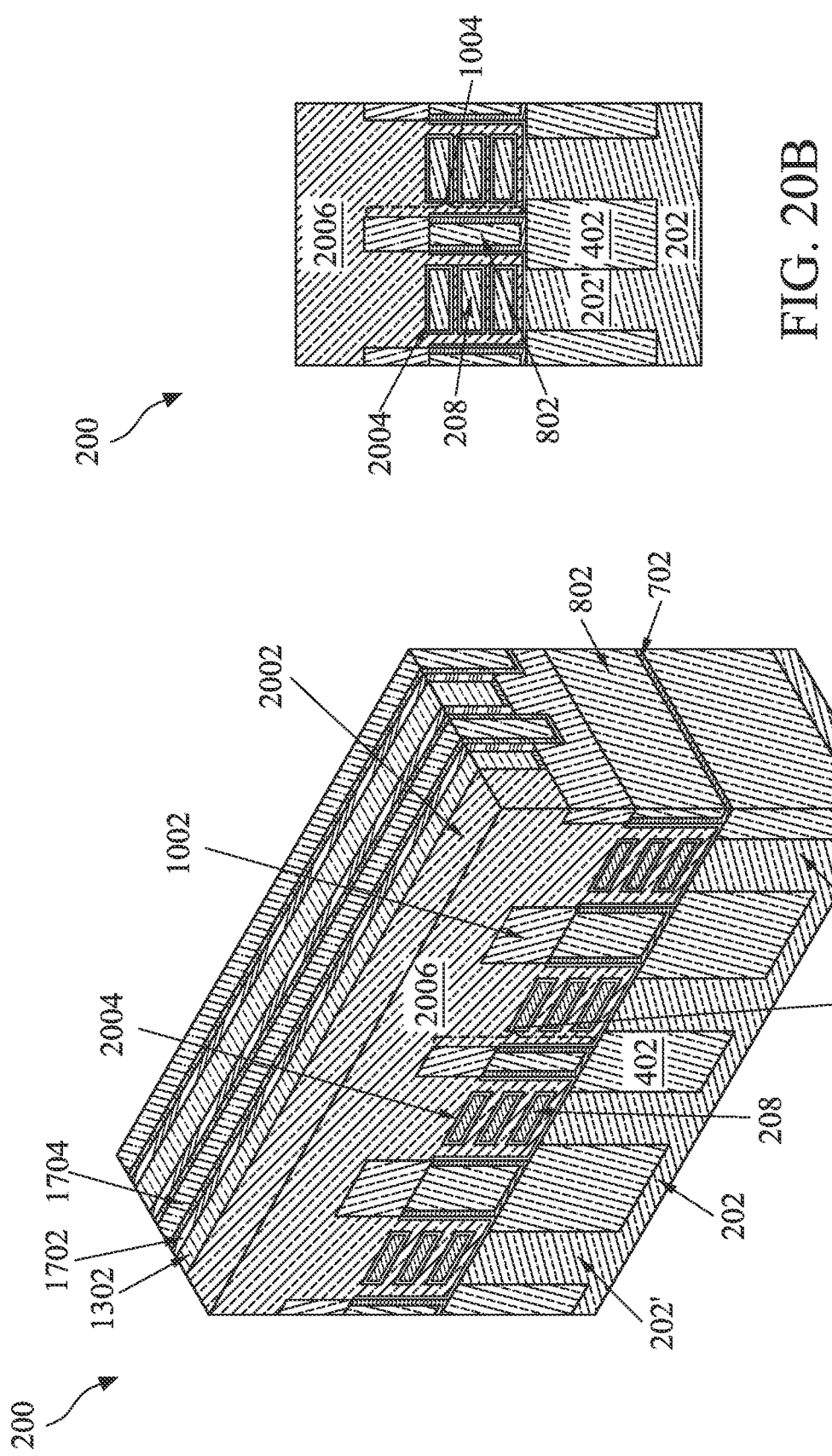

The method 100 then proceeds to block 120 where a metal gate structure is formed in the openings provided by block 118. The metal gate structure may be the functional gate(s) of the completed device 200. Referring to the example of FIGS. 20A and 20B, illustrated are metal gate structures 2002 formed in the openings 1902 provided by block 118. Metal gate structures 2002 are configured to achieve desired functionality according to design requirements of multigate device 200. Metal gate structures 2002 each include a gate dielectric 2004 (e.g., high-k gate dielectrics and/or interfacial layers such as silicon oxide or silicon oxynitride) and a gate electrode 2006 (for example, a work function layer and a bulk conductive layer). Metal gate structures 2002 may include numerous other layers, for example, capping layers, interface layers, diffusion layers, barrier layers, hard mask layers, or combinations thereof. In some embodiments, forming metal gate structures 2002 includes depositing a gate dielectric layer 2004 over the channel regions, where the gate dielectric layer partially fills gaps between channel layers 208, depositing a gate electrode layer 2006 over the gate dielectric layer 2004, where the gate electrode layer fills a remainder of the gaps between channel layers 208.

Gate dielectric 2004 includes a high-k dielectric layer, which includes a high-k dielectric material, which for purposes of metal gate structure 2002 refers to a dielectric material having a dielectric constant that is greater than that of silicon dioxide (k≈3.9). For example, the high-k dielectric layer includes $HfO_2$, HfSiO, $HfSiO_4$, HfSiON, HfLaO, HfTaO, HfSiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material for metal gate stacks, or combinations thereof. The high-k dielectric layer is formed by any of the processes described herein, such as ALD, CVD, PVD, oxidation-based deposition process, other suitable process, or combinations thereof. For example, an ALD process deposits the high-k dielectric layer. In some embodiments, the ALD process is a conformal deposition process, such that a thickness of the high-k dielectric layer is substantially uniform (conformal) over the various surfaces of multigate device 200. In some embodiments, gate dielectric 2004 includes an interfacial layer disposed between the high-k dielectric layer and channel layers 208. The interfacial layer includes a dielectric material, such as $SiO_2$, HfSiO, SiON, other silicon-comprising dielectric material, other suitable dielectric material, or combinations thereof. The interfacial layer is formed by any of the processes described herein, such as thermal oxidation, chemical oxidation, ALD, CVD, other suitable process, or combinations thereof. For example, the interfacial layer is formed by a chemical oxidation process that exposes exposed surfaces of channel layers 208 to hydrofluoric acid. In some embodiments, the interfacial layer is formed by a thermal oxidation process that exposes the exposed surfaces of channel layers 208 to an oxygen and/or air ambient. In some embodiments, the interfacial layer is formed after forming the high-k dielectric layer. For example, in some embodiments, after forming the high-k dielectric layer, multigate device 200 may be annealed in an oxygen and/or nitrogen ambient (e.g., nitrous oxide).

Gate electrode 2006 is formed over gate dielectric 2004, filling a remainder of gate openings 1902 and wrapping channel layers 208, such that gate electrode 2006 fills a remainder of gaps between channel layers. Gate electrode 2006 includes a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, the gate electrode 2006 includes a work function layer and a bulk conductive layer. The work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, ZrSi$_2$, MoSi$_2$, TaSi$_2$, NiSi$_2$, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. Gate electrode 2006 is formed by any of the processes described herein, such as ALD, CVD, PVD, plating, other suitable process, or combinations thereof. In an implementation, a planarization process to remove some excess gate materials from multigate 200. For example, a CMP process is performed such that a top surface of gate structures 2002 are substantially planar with a top surface of ILD layer 1704 after the CMP process.

Referring to the example of FIGS. 21A and 21B, the gate structure 2006 is etched back such that a top surface of the metal gate structure 2002 is substantially coplanar with a top surface of the dielectric fin 1004. This leaves an opening 2102 disposed above the metal gate structure 2600. Dielectric fins 1004 extend between the metal gate structures 2002 on different channel regions. For example, an etch back process is performed to recess gate electrodes 2006 until top surfaces of dielectric fins 1004 are free of gate electrode 2006 material.

In some implementations, the gate structure 2006 is further recessed from a top surface of the dielectric fins 1004 and an additional layer or layer(s) are formed on the recessed gate structure 2006. In an embodiment, a seed layer is disposed over the metal gate structure and adjacent the dielectric fin. The seed layer may be Ti, TiN, TaN, W, Ru, and/or combinations thereof. Exemplary thicknesses include between those between approximately 1 nm to 2 nm. In some implementations, the thickness is selected to provide sufficient thickness for adhesion to an overlying layer and desired resistivity of the overlying metallization discussed below. The deposition processes of the seed layer may include CVD, PVD, ALD, HDPCVD, MOCVD, RPCVD, PECVD, LPCVD, ALCVD, APCVD, PEALD, electroplating, electroless plating, other suitable deposition methods, or combinations thereof. FIGS. 30A and 30B are illustrative of a seed layer 2602 formed over the gate electrode 2006 and having sidewalls abutting the dielectric fins 1004 illustrating the recessed gate structure 2006 on which the seed layer 2602 is disposed. While in some implementations the seed layer 2602 of FIGS. and 30B is formed prior to depositing the dummy layer 2202 as discussed here, in other embodiments, the seed layer 2602 as illustrated in FIGS. 30A and 30B is formed after the gate separation feature.

Figure 31B:
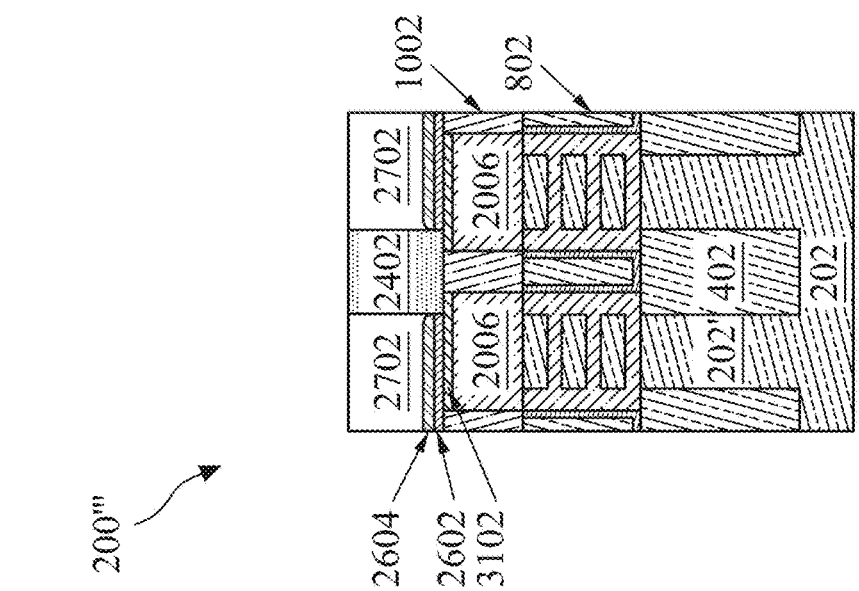
FIGS. 31A and 31B are fragmentary perspective view and cross-sectional view of another embodiment of a fourth multigate device, in portion or entirety, which may be fabricated according to various aspects of the present disclosure.
Figure 31A:
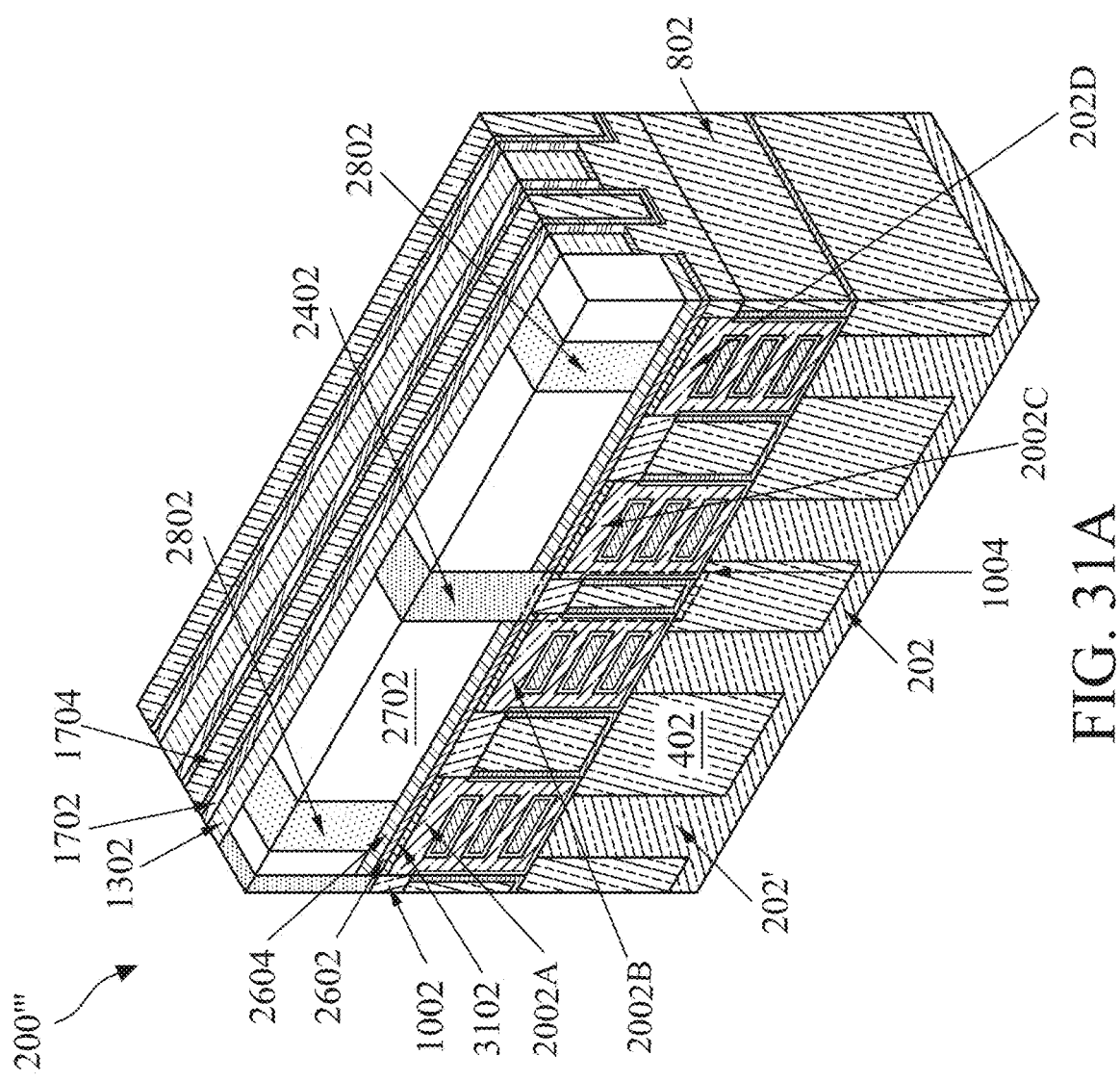
Figure 32:
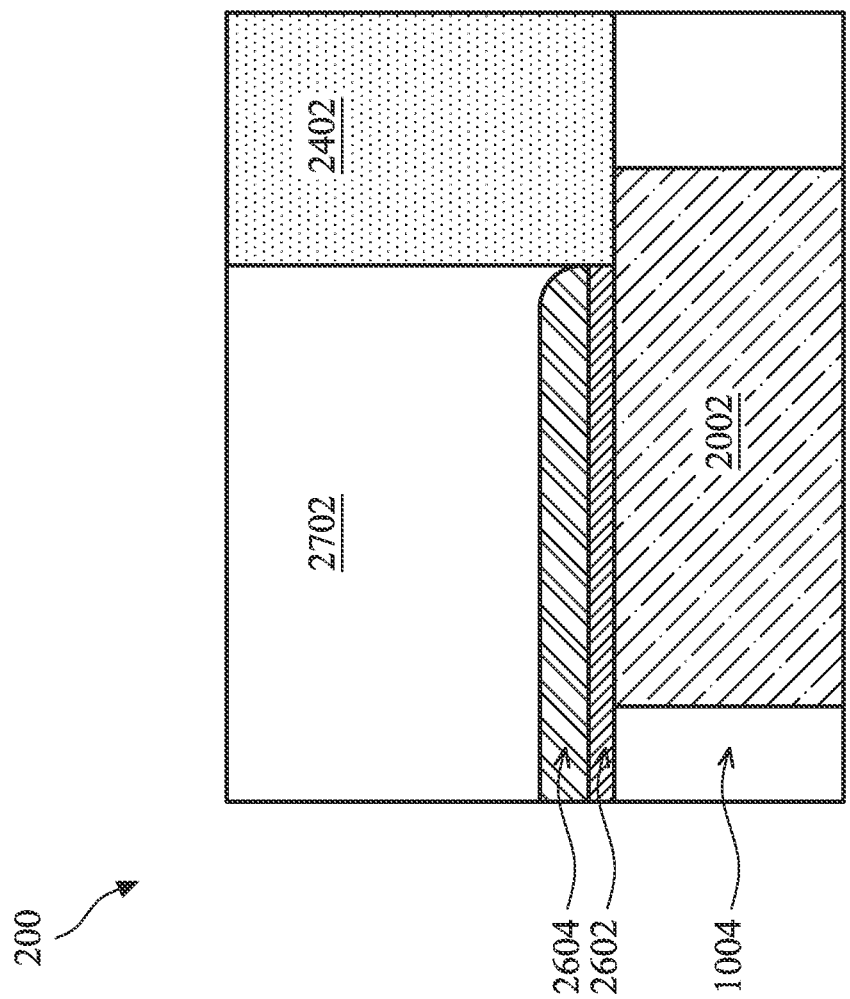
FIG. 32 is a fragmentary cross-sectional view of a detailed view of a metallization of a multigate device according to one or more aspects of the present disclosure.

In some implementations, the gate structure is further recessed from a top surface of the dielectric fins 1004 and an etch stop layer is disposed over the metal gate structure and adjacent the dielectric fin. The etch stop layer may be a metal nitride, and/or other suitable compositions. The etch stop layer is conductive to allow interconnection of the gate structure. The deposition processes of the etch stop layer may include CVD, PVD, ALD, HDPCVD, MOCVD, RPCVD, PECVD, LPCVD, ALCVD, APCVD, PEALD, electroplating, electroless plating, other suitable deposition methods, or combinations thereof. FIGS. 31A and 32 provide an example of an etch stop layer 3102 over the gate structure 2002 adjacent the dielectric fins 1004. The etch stop layer 3102 may provide additional protection for the gate structure 2002 when etching the trenches 2302, discussed below. Thus, the etch stop layer 3102 may have a composition selected to provide etch selectivity to the dummy layer 2202.

After the etch back process(es) and/or planarization, adjacent gate electrodes 2006 may not extend between a first channel region (fin 212) to second channel region (adjacent fin 212). In other words, the conductivity of the gate structures 2002 is interrupted between adjacent channel regions (e.g., by the dielectric fins 1004). Thus, in some embodiments, at this point in the method 100, the gate electrodes 2006 are insulated, electrically, from one another. The metal gate cut or separation process may be referred to as "self-aligned" because gate isolation structures (here, dielectric fins 1004) are aligned between adjacent metal gate structures 2002 without having to perform a lithography process after forming metal gate structures 2002. The self-aligned placement of the dielectric fins 1004 provides electrical isolation between devices in adjacent active regions.

Figures 22A, 22B:
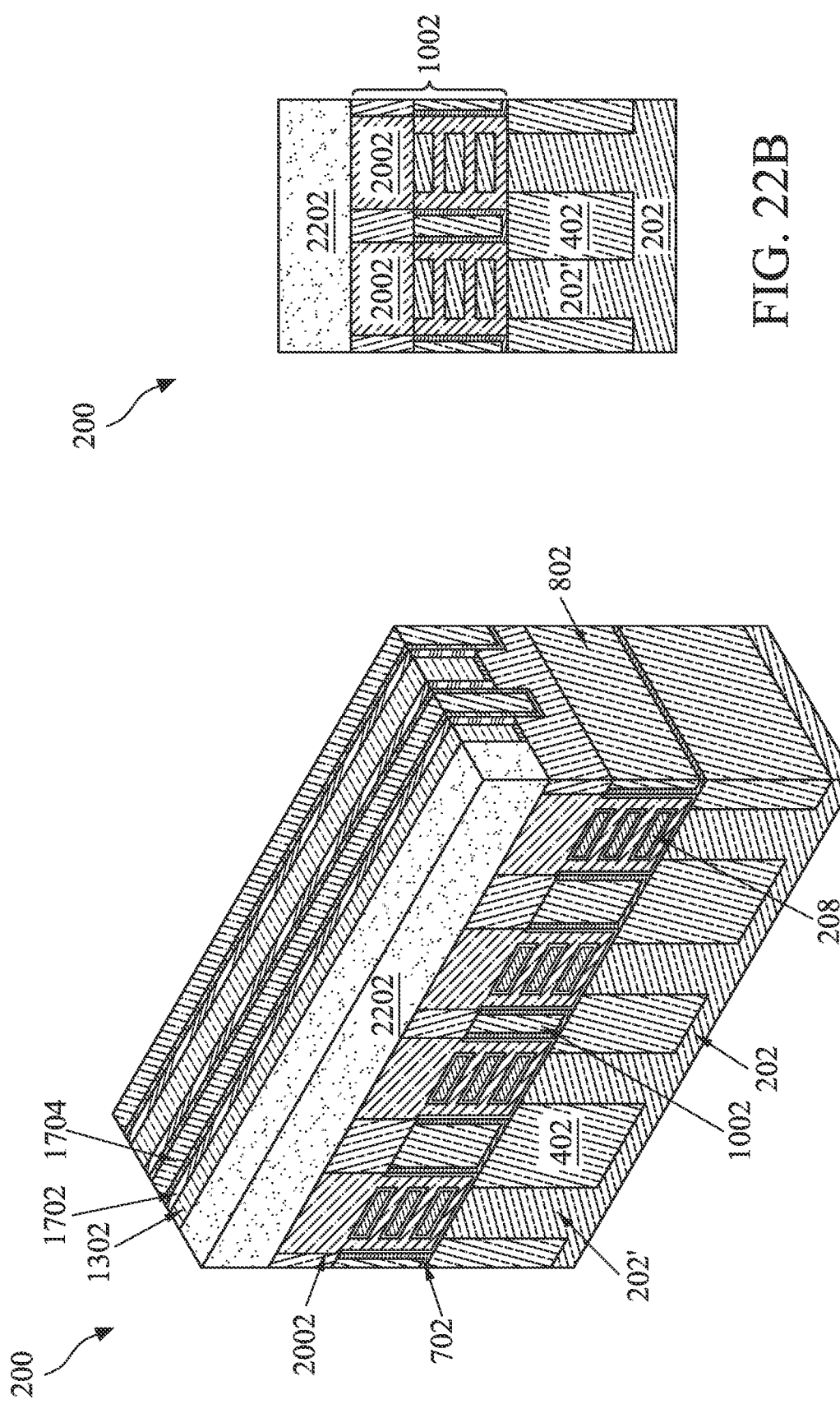
Figure 23B:
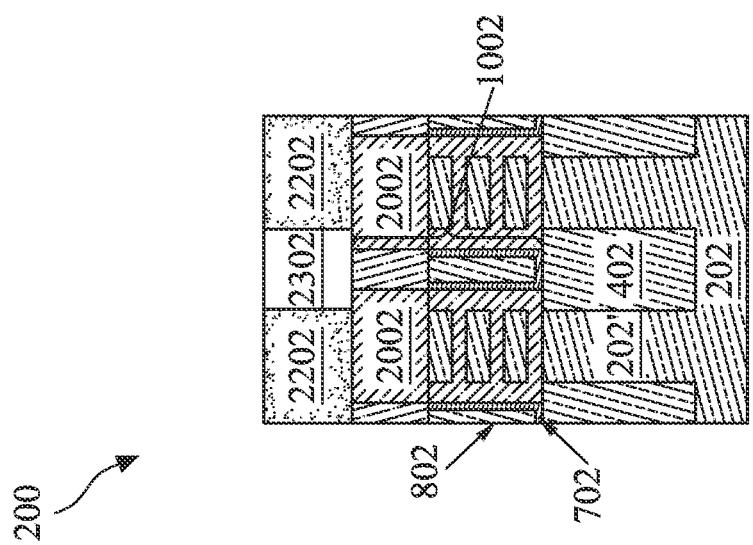
Figure 23A:
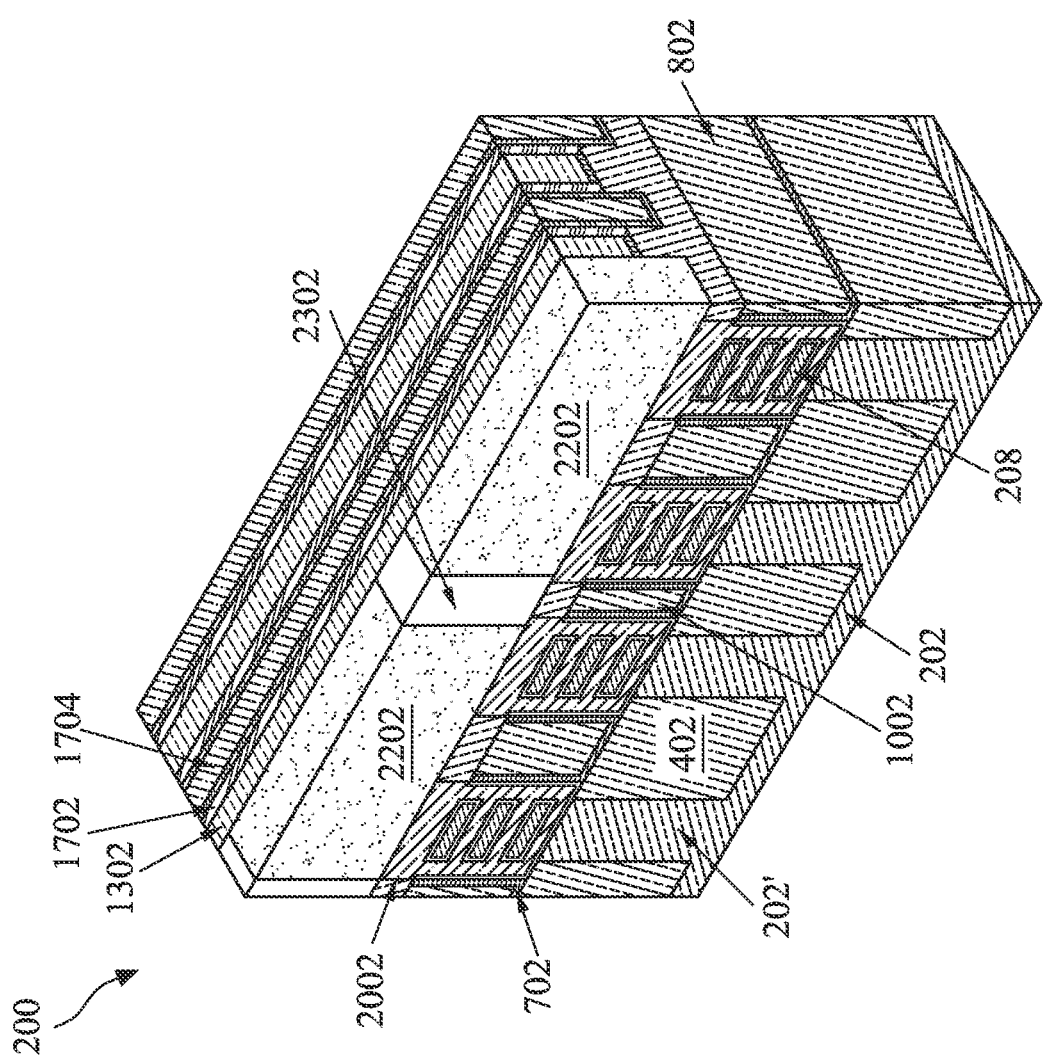

The method 100 then proceeds to block 122 where a dummy material layer is formed over the gate structure. In an embodiment, the dummy material layer is silicon. In other embodiments, the dummy material includes SiO, SiN, SiC, SiCN, SiON, SiCN, SiOCN, AlO, AlN, AlON, ZrO, ZrN, ZrAlO, HfO, and/or other suitable materials. The dummy material may be sacrificial and selected such that it has suitable etch selectivity, for example, when forming, for example, the trenches discussed in block 124. In an embodiment, the dummy layer has a high etch selectivity with respect to the material of the metal gate structure 2002 and in particular the gate electrode 2006. The dummy material layer may be deposited by spin-on coating, CVD, PVD, ALD, HDPCVD, MOCVD, RPCVD, PECVD, LPCVD, ALCVD, APCVD, PEALD, other suitable deposition methods, or combinations thereof. Referring to the example of FIGS. 22A and 22B, a dummy layer 2202 is formed. In some implementations, after deposition, a planarization process such as CMP is performed to remove excess dummy material and provide a planar top surface such as illustrated in FIGS. 22A and 22B.

The method 100 then proceeds to block 124 where a plurality of trenches defining gate separation regions is formed in the dummy layer. The gate separation regions are those regions identified as portions of the device where adjacent gate structures (e.g., of adjacent GAA devices) are to be insulated from one another. In some embodiments, the gate separation regions are between a device of a first type (e.g., n-fet) and a device of a second type (e.g., p-fet). The plurality of trenches defining the gate separation regions may be formed by providing a pattern of features over the dummy layer. In some embodiments, masking elements are provided to define openings over the dummy layer where the plurality of trenches are to be etched. In some embodiments, photolithography processes may include forming a photoresist layer overlying the device 200 and the dummy layer 2202, exposing the photoresist layer to a pattern, performing post-exposure bake processes, and developing the photoresist layer to form a masking element including the photoresist layer.

According to the pattern provided by the photoresist layer, trenches are etched in the dummy layer. Referring to the example of FIGS. 23A and 23B, trenches 2302 are formed in the dummy layer 2202 extending to the dielectric layer 1002 and/or the top of the dielectric fin 1004. Because of composition of the dummy layer 2202 and the gate structure 2002, in particular the gate electrode 2006, and the etch selectivity therebetween, in some implementations, it is possible to form the trenches 2302 such that substantially no material of the metal gate structure 2002 is etched. In some embodiments, because of composition of the dummy layer 2202 and dielectric layer 1002 and the etch selectivity therebetween, in some implementations, it is possible to form the trenches 2302 such that the dielectric layer 1002 is substantially unetched. The etching process may be formed by a dry etching process.

The method 100 then proceeds to block 126 where the trenches are filled with dielectric material(s) to form a gate separation feature. Exemplary dielectric materials filling the trenches include SiO, SiN, SiC, SiCN, SiON, SiCN, SiOCN, AlO, AlN, AlON, ZrO, ZrN, ZrAlO, HfO, and/or combinations thereof. Exemplary deposition techniques include CVD, PVD, ALD, HDPCVD, MOCVD, RPCVD, PECVD, LPCVD, ALCVD, APCVD, PEALD, other suitable deposition methods. After deposition, a planarization or other etch back process may remove excess material to form the gate separation feature.

Referring to the example of FIGS. 24A and 24B, dielectric material is formed in trenches 2302 to form gate separation features 2402. In some implementations, the gate separation features 2402 are a multi-layer component. The dielectric material may be deposited by various deposition methods, and subsequently planarized, such as by CMP, to provide a planar top surface with the dummy layer 2202 illustrated in FIGS. 24A and 24B.

Figure 25B:
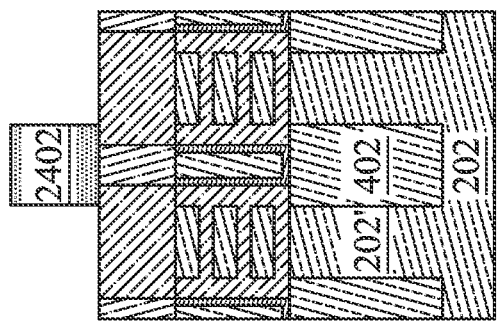
Figure 25A:
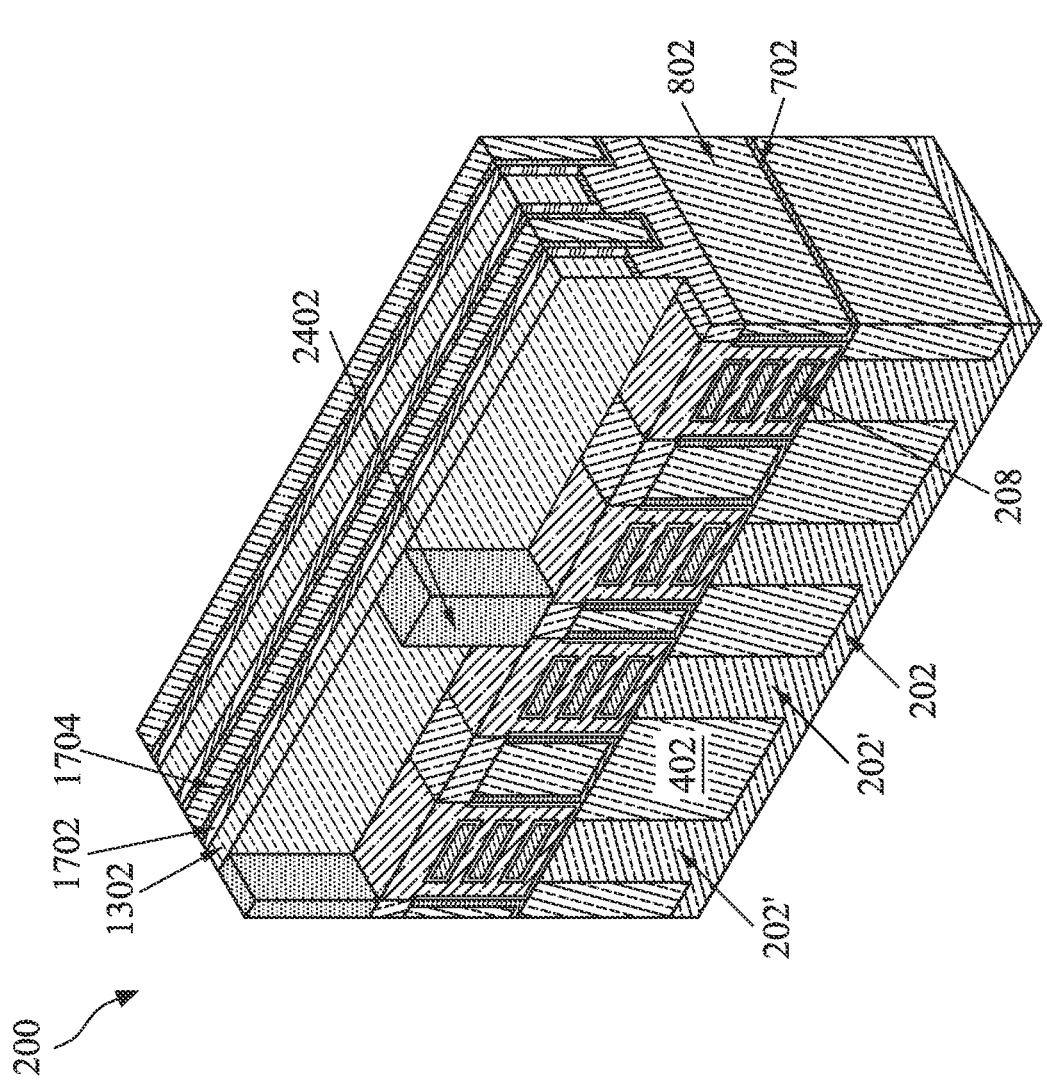

After depositing material in the trenches, the remainder of the dummy layer is removed. The dummy layer may be removed by a suitable selective etch process for example, a dry etch, wet etch process, or strip process. As illustrated in the example of FIGS. 25A and 25B, the dummy layer 2202 is then removed. In some implementations the dummy layer 2202 is removed without impacting (e.g., etching) the gate.

The method 100 then proceeds to block 128 where at least one metallization layer is formed over the gate structures. In some implementations, at least one metallization layer is formed over adjacent gate structures and extends between the gate structures. In other words, the metallization layer(s) may be disposed over and in contact with a first gate structure of a first device and extend to be disposed over and in contact with a second, adjacent gate structure of a second device thereby electrically connecting the two gate structures. Between the two connected gate structures, the metallization layer(s) extend over the dielectric fin between the active regions of the adjacent devices. Because of the gate separation features discussed above in block 126, other adjacent gate structures (e.g., a third gate structure on adjacent an opposing side of the first gate structure) having the gate separation feature therebetween may be isolated from one another. In other words, the metallization layer(s) do not extend between certain gates of devices having the gate isolation feature disposed therebetween and thus, does not provide an electrical connection between said gates. The patterning of gate structures to be connected and insulated is determined by the device design and is defined by the pattern forming the trenches of block 124, which provides the gate separation features.

Figures 26A, 26B:
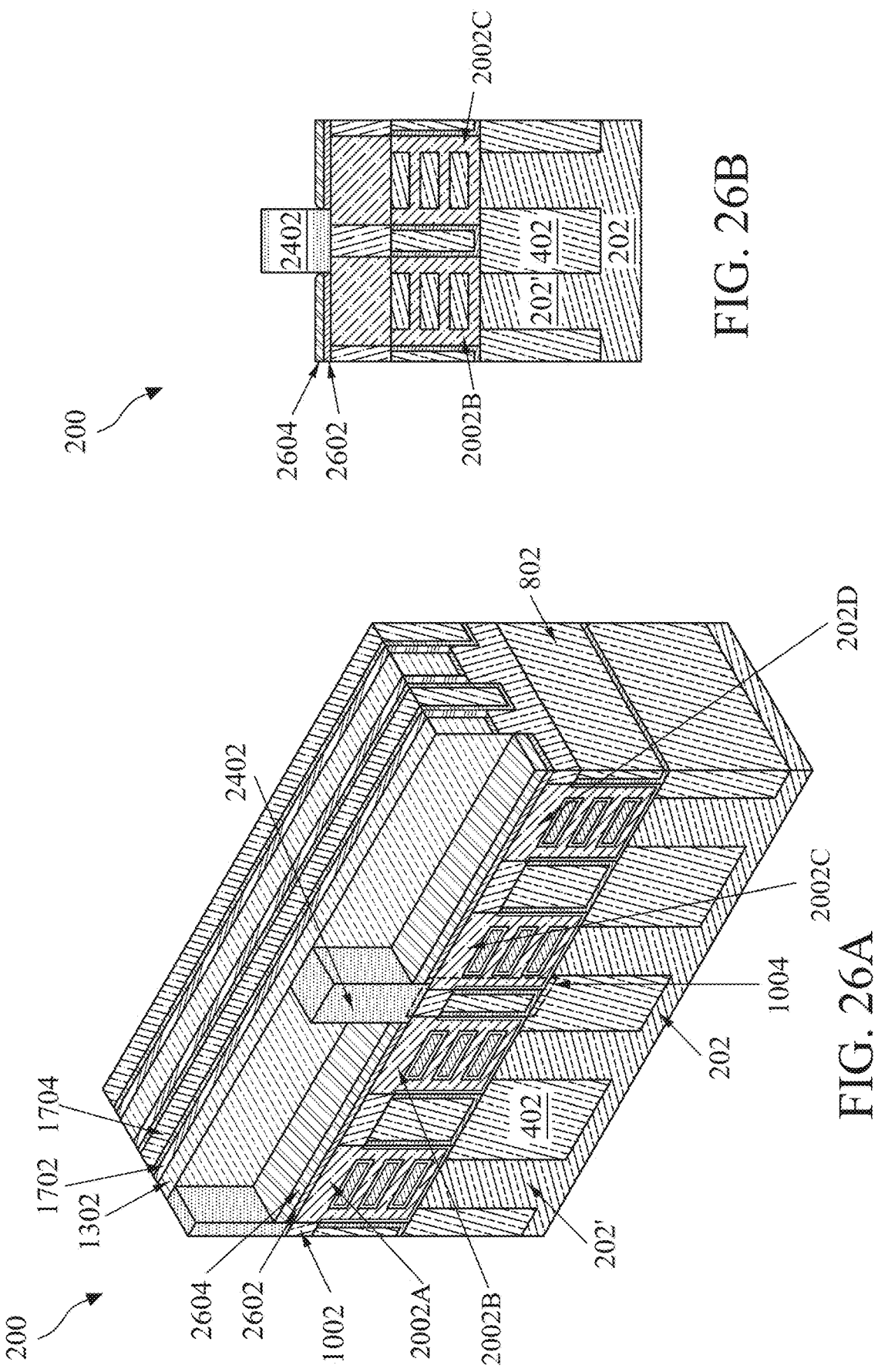
Figure 27B:
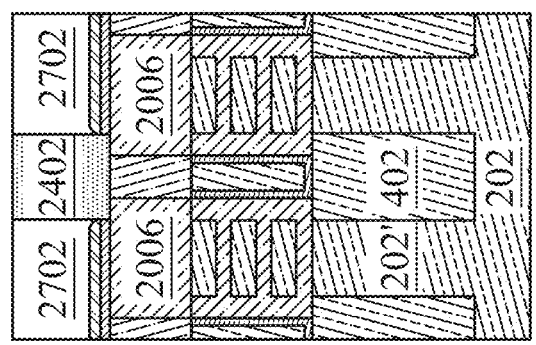
Figure 27A:
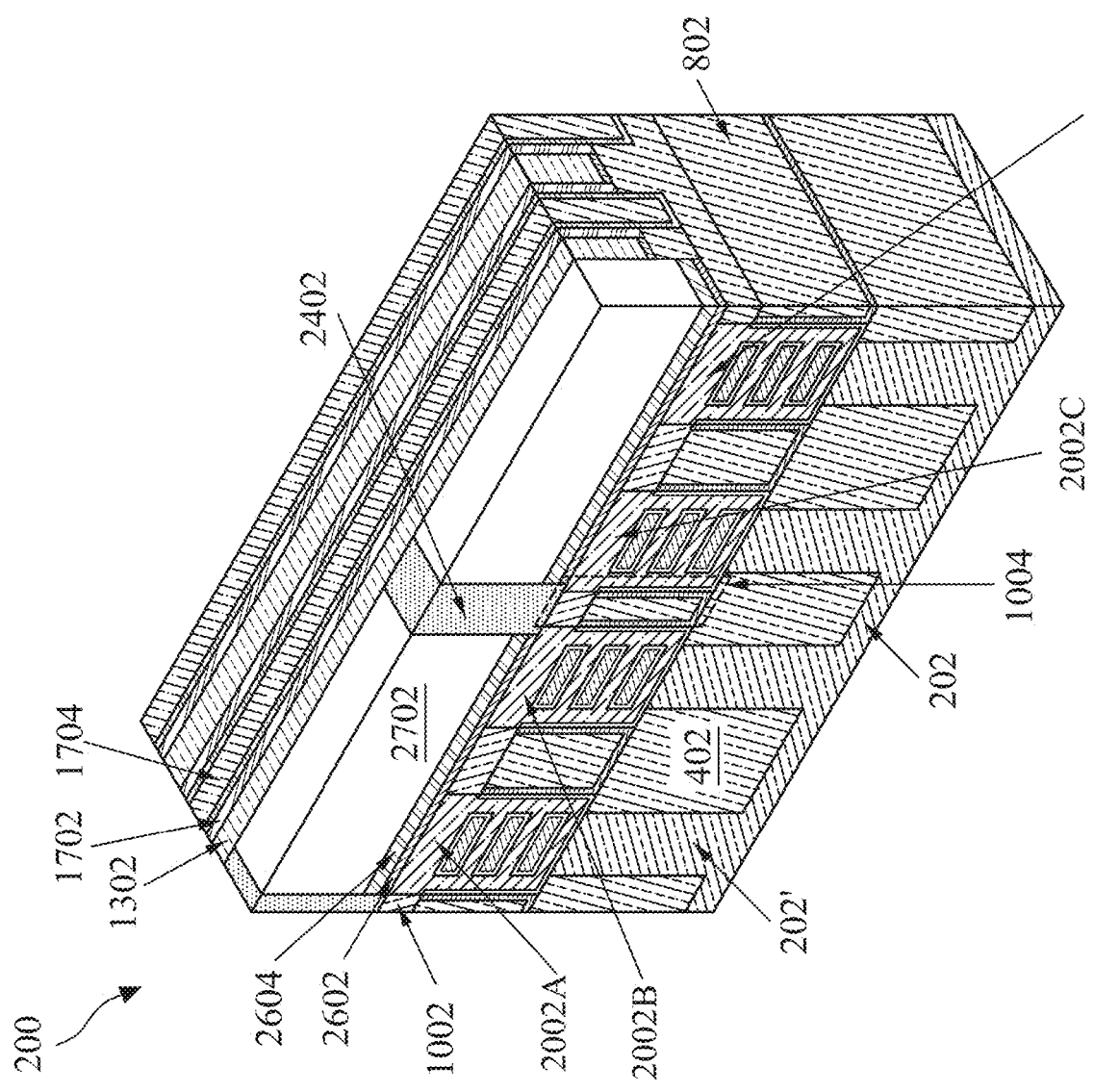
Figures 28A, 28B:
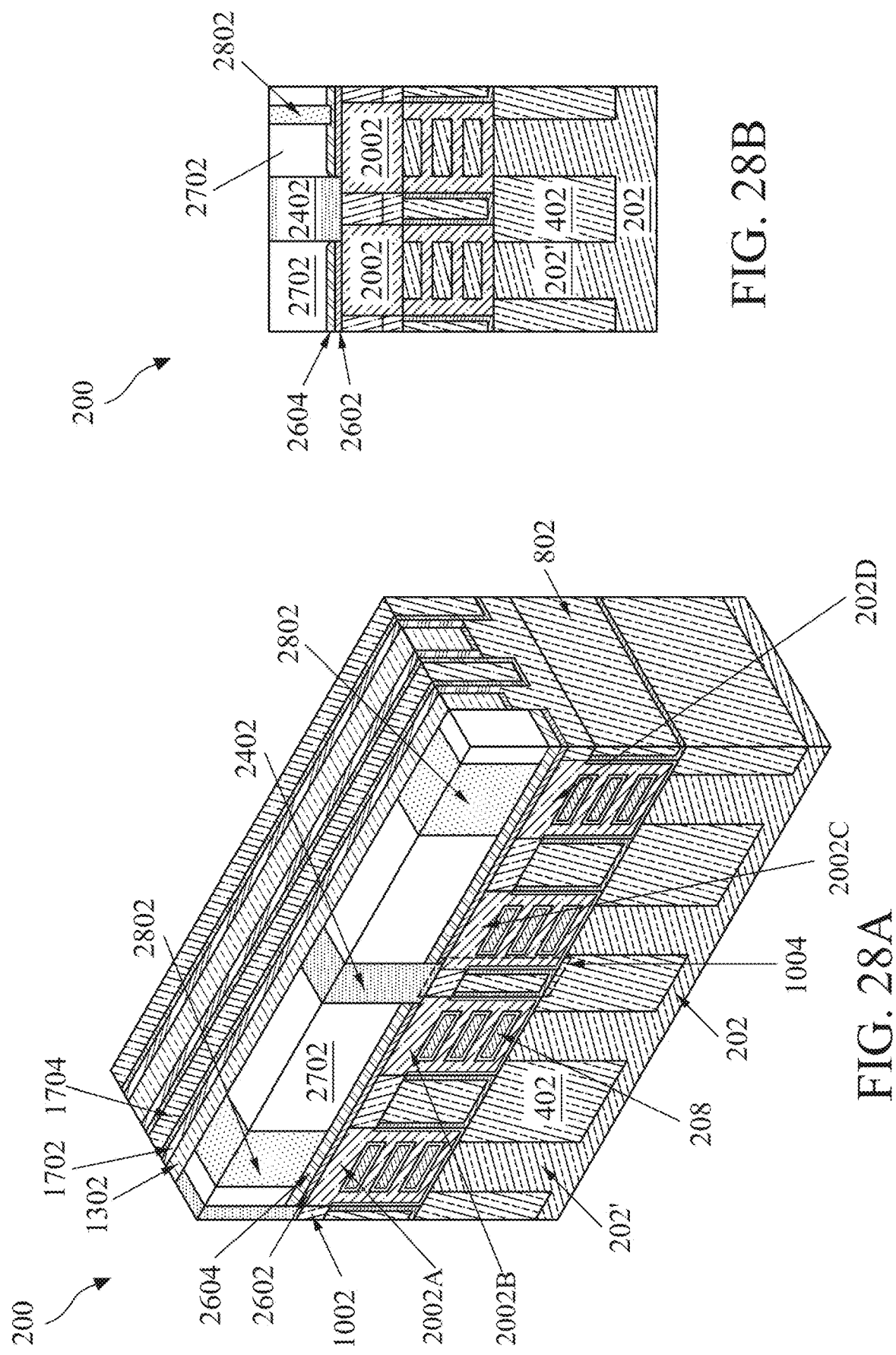

Referring to the example of FIGS. 26A and 26B, in an embodiment, a first conductive layer, referred to as seed layer 2602, and a metallization layer 2604 are formed on the device 200. As illustrated in FIG. 26A, the seed layer 2602 and the metallization layer 2604 may extend between certain gate structures 2002 such as from a first gate structure denoted 2002A, to a second gate structure denoted 2002B and between a third gate structure 2002C and a fourth gate structure 2002D. The gate separation feature 2402 interposes the second gate structure 2002B and the third gate structure 2002C such that the metallization of layers 2602 and 2604 does not extend between gate structures 2002B and 2002C. Thus, the metallization layers 2602, 2604 each have a terminal end that abuts the gate separation feature 2402. Again, each gate structure 2002A, 2002B, 2002C, 2002D provides a gate structure for a GAA device part of the device 200.

The seed layer 2602 may include Ti, TiN, TaN, W, Ru, and/or combinations thereof. Exemplary thicknesses include between those between approximately 1 nm to 2 nm. In some implementations, the thickness is selected to provide sufficient thickness for adhesion to an overlying layer and desired resistivity of the metallization stack. The metal layer 2604 may include W, Ru, Co, and/or combinations thereof. Exemplary thicknesses include those between approximately 2 and 5 nm. In some implementations, the thickness is selected to provide sufficient thickness for conductivity to an adjacent gate stack. The deposition processes of the seed layer 2602 and/or the metallization layer 2604 may include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some implementations, the material for the seed layer 2602 is deposited and subsequently etched back to be provided within the relevant openings.

In an embodiment, the seed layer 2602 is omitted, while the metal layer 2604 provides the at least one metallization layer connecting a subset of the gates. This is exemplified by the embodiment of device 200' of FIGS. 23A and 23B. The metallization layer 2604 of device 200' in FIGS. 23A and 23B may be substantially similar to as discussed above with reference to device 200.

The method 100 then proceeds to block 130 where an insulating layer is formed over the metallization layer(s) of block 128. Exemplary insulating layer materials include SiO, SiN, SiC, SiCN, SiON, SiCN, SiOCN, AlO, AlN, AlON, ZrO, ZrN, ZrAlO, HfO, and/or combinations thereof. The insulating material may be deposited by spin-on coating, HARP, CVD, PVD, ALD, HDPCVD, MOCVD, RPCVD, PECVD, LPCVD, ALCVD, APCVD, PEALD, and/or other suitable methods. In some implementations, after deposition, the insulating material is etched back such as by a planarization process (e.g., CMP) to provide a top surface substantially coplanar with the gate separation feature. Referring to the example of FIGS. 27A and 27B, the insulating layer 2702 is formed over the seed/metallization layers 2602 and 2604 and adjacent the gate separation feature 2402. In some embodiments, the insulating layer 2702 has the same composition as the gate separation feature 2402. In other embodiments, the insulating layer 2702 differs in composition from the gate separation feature 2402.

In an embodiment, the insulating layer 2702 may abut the gate spacers, which in turn abut the B-CESL 1702, which is adjacent the ILD 1704.

The method 100 then proceeds to block 132 where a contact element to the metallization layer(s) of block 128 is formed. Referring to the example of FIGS. 28A and 28B, a contact element 2802 is formed to interface the metallization layer 2604. The contact element 2802 may provide for a path for electrical connection to the gate structures 2002 from a multi-layer interconnect (MLI) formed over device 200.

A MLI electrically couples various devices (for example, p-type transistors and/or n-type transistors of multigate device 200, resistors, capacitors, and/or inductors) and/or components (for example, gate electrodes and/or epitaxial source/drain features of p-type transistors and/or n-type transistors), such that the various devices and/or components can operate as specified by design requirements of multigate device 200. An MLI feature typically includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI. During operation, the interconnect features are configured to route signals between the devices and/or the components of multigate device 200 and/or distribute signals (for example, clock signals, voltage signals, and/or ground signals) to the devices and/or the components of multigate device 200.

In some embodiments, the contact is formed by first etching a via in the insulating layer extending to the metallization layer(s) over the gate structure. In some embodiments, the via is defined by a photolithography process. The lithography processes may include forming a resist layer over insulating layer 2702, exposing the resist layer to patterned radiation, and developing the exposed resist layer, thereby forming a patterned resist layer that can be used as a masking element for etching contact opening(s) that extend through insulating layer 2702 to expose the metallization layer(s) for device 200, specifically at least to the metal layer 2604. The etching processes include dry etching processes, wet etching processes, other etching processes, or combinations thereof. Thereafter, the contact opening(s) are filled with one or more electrically conductive materials, such as tungsten, ruthenium, cobalt, copper, aluminum, iridium, palladium, platinum, nickel, other low resistivity metal constituent, alloys thereof, or combinations thereof. The conductive material(s) can be deposited by PVD, CVD, ALD, electroplating, electroless plating, other suitable deposition process, or combinations thereof. In some embodiments, contact elements 2802 include a bulk layer (also referred to as a conductive plug). In some embodiments, contact elements 2802 include a barrier layer, an adhesion layer, and/or other suitable layer disposed between the bulk layer and insulating layer 2702. In some embodiments, the barrier layer, the adhesion layer, and/or other suitable layer include titanium, titanium alloy (for example, TiN), tantalum, tantalum alloy (for example, TaN), other suitable constituent, or combinations thereof. Additional features of the MLI may interface a top surface of the contact element 2802 including, for example, a metal line or conductive via.

The method 100 then continues to block 134 where additional fabrication steps are performed. The additional fabrication steps can include forming other elements of the MLI discussed above including contacts to the source/drain features, such as source/drain features 1602. The contacts to the source/drain features may, like the contact element 2802, include performing a lithography processes include forming a resist layer over respective ILD layer 1704 and CESL 1702, exposing the resist layer to patterned radiation, and developing the exposed resist layer, thereby forming a patterned resist layer that can be used as a masking element for etching source/drain contact opening(s) that extend through ILD layer 1704 and CESL 1702 to expose epitaxial source/drain features 1602. The etching processes include dry etching processes, wet etching processes, other etching processes, or combinations thereof. Thereafter, the source/drain contact opening(s) are filled with one or more electrically conductive materials, such as tungsten, ruthenium, cobalt, copper, aluminum, iridium, palladium, platinum, nickel, other low resistivity metal constituent, alloys thereof, or combinations thereof. The conductive material(s) can be deposited by PVD, CVD, ALD, electroplating, electroless plating, other suitable deposition process, or combinations thereof. In some embodiments, source/drain contacts include a bulk layer (also referred to as a conductive plug and further include a barrier layer, an adhesion layer, and/or other suitable layer disposed between the bulk layer and ILD layer 1704 and/or CESL 1702. In some embodiments, the barrier layer, the adhesion layer, and/or other suitable layer include titanium, titanium alloy (for example, TiN), tantalum, tantalum alloy (for example, TaN), other suitable constituent, or combinations thereof.

Accordingly, multigate device 200 includes a plurality of gate structures 2002. In some implementations, gate structure 2002A and 2002B are for a first device type (e.g., NFET). In some implementations, gate structures 2002C and 2002D are for a second device type (e.g., PFET).

Referring again to FIGS. 29A and 29B, illustrated is the device 200' which is substantially similar to the device 200 but having a metallization layer 2604 and omitting a seed layer 2602. Referring again to FIGS. 30A and 30B, illustrated is the device 200" which is substantially similar to the device 200 but having a metallization layer 2604 and having a seed layer 2602 disposed over the gate structure 2002 and not extending between gate structures. Referring again to FIGS. 31A and 31B, illustrated is the device 200'" which is substantially similar to the device 200 but having a metallization layer 2604, a seed layer 2602, and an etch stop layer 3102. The etch stop layer 3102 is discussed in further detail above.

Referring now to FIG. 32, illustrated is a detailed view of the interface between the seed layer 2602, metallization 2604, gate structure 2002, gate separation feature 2402, and insulating layer 2702. As illustrated by FIG. 32, a terminal end of at least one of the metallization layers, illustrated here with metallization layer 2604 is rounded such that it has a curvilinear end surface. In particular, the end of the metallization layer 2604 that abuts the gate separation feature 2402 is round/curvilinear. In some implementations, this curvilinear end is provided by the formation of the metallization layer 2604 within the opening (see FIGS. 25A, adjacent the gate separation feature 2402. While FIG. 32 illustrates the rounding of the embodiment of device 200, the rounding may also be applicable to one or more of the metallization layers of the devices 200', 200'', and/or 200'''.

From the foregoing description, it can be seen that multigate devices described in the present disclosure offer advantages over conventional multigate devices. It is understood, however, that other embodiments may offer additional advantages, and not all advantages are necessarily disclosed herein, and that no particular advantage is required for all embodiments. One advantage is that fabrication processes described herein reduce a size and/or a footprint of metal gates of transistors, compared to transistors fabricated using conventional metal gate cut techniques, thereby allowing for higher packing density of transistors and increasing IC pattern density. Further, some embodiments provide for avoiding damage to the gate structure, such as work function material of the gate electrode, when providing the separation between adjacent gate structures. By providing the separation, the "cut", before depositing the metallization layers connecting adjacent gate structures, the gate damage can be avoided in comparison, for example, by not cutting the metallization layers over the metal gate structures where limited etch selectivity may be possible.

The present disclosure provides for many different embodiments. An exemplary device includes a device including a substrate, a first gate structure wrapping around a channel layer disposed over the substrate; a second gate structure wrapping around another channel layer disposed over the substrate and a dielectric fin structure formed over a shallow trench isolation (STI) feature. The dielectric fin structure is between the first gate structure and the second gate structure. At least one metallization layer is formed on the first gate structure, the dielectric fin structure, and the second gate structure and contiguously extend from the first gate structure to the second gate structure.

In a further embodiment, the at least one metallization layer includes a seed layer and a first metal layer. The seed layer may include at least one of titanium (Ti), titanium nitride (TiN), tantalum (TaN), or tungsten (W). In some implementations, a sidewall of the seed layer interfaces the dielectric fin structure. In an embodiment, the at least one metallization layer physically interfaces a top surface of the dielectric fin structure. The top surface of the dielectric fin structure may be a high-k dielectric material. In an embodiment, a third gate structure is separated from the second gate structure by a second dielectric fin. A gate separation feature may be disposed over the second dielectric fin. In some implementations, the at least one metallization layer abuts a sidewall of the gate separation feature. In a further embodiment, an end of the at least metallization layer abuts the sidewall of the gate separation feature includes a curvilinear surface.

In another of the embodiments discussed herein provided is a device including a first channel layer disposed between first source/drain features over a substrate. A first metal gate surrounds the first channel layer. A second channel layer is disposed between second source/drain features over the substrate. A second metal gate surrounds the second channel layer and a dielectric fin is disposed between and separating the first metal gate and the second metal gate. A first portion of a conductive layer is formed over the first metal gate and a second portion of the conductive layer is formed over the second metal gate. The device further includes an isolation layer between the first portion and second portion of the conductive layer and over the dielectric fin. At least one of the first portion of the conductive layer or the second portion of the conductive layer includes a rounded terminal end abutting the isolation layer.

In a further embodiment, the device includes the isolation layer interfacing a top surface of the dielectric fin. In an embodiment, an etch stop layer is disposed between the first portion of the conductive layer and the first metal gate. In an embodiment, a seed layer interposes the first portion of the conductive layer and the first metal gate. In some implementations, a top surface of the seed layer is below a top surface of the dielectric fin.

In another of the broader embodiments discussed herein, provided is a method that includes forming a first gate structure, a first source structure and a first drain structure of a first gate all around (GAA) device over a substrate. The method continues to include forming a second gate structure, a second source structure and a second drain structure of a second GAA over the substrate, wherein a dielectric fin is disposed between the first gate structure and the second gate structure. A dummy layer is deposited over the first gate structure, the second gate structure, and the dielectric fin. The dummy layer is patterned to form a trench within the dummy layer over the dielectric fin. The trench is filled with a dielectric material to form a dielectric feature. The method continues to remove the patterned dummy layer after filling the trench. At least one conductive layer is deposited having a first portion over the first gate structure and a second portion of the second gate structure. The dielectric feature interposes the first and second portion.

In a further embodiment, the method includes depositing insulating material over the first and second portions of the conductive layer. In an embodiment, the method includes forming a conductive via to the second portion of the conductive layer. In an embodiment, the method includes patterning the dummy layer to form the trench includes selectively etching material of the dummy layer while substantially not etching the first gate structure or the second gate structure. The method may further provide depositing the at least one conductive layer including depositing a seed layer and an overlying metal layer. In an embodiment, the method's depositing the at least one conductive layer includes depositing conductive material of the at least one conductive layer having a rounded terminal region abutting the dielectric feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method including,
forming a first gate structure, a first source structure and a first drain structure of a first gate all around (GAA) device over a substrate;
forming a second gate structure, a second source structure and a second drain structure of a second GAA device over the substrate, wherein a dielectric fin is disposed between the first gate structure and the second gate structure;
depositing a dummy layer over the first gate structure, the second gate structure, and the dielectric fin;

patterning the dummy layer to form a trench within the dummy layer over the dielectric fin, the trench having a bottom surface of a first dielectric material of the dielectric fin, a first sidewall of the dummy layer and a second sidewall of the dummy layer, the second sidewall opposing the first sidewall;

filling the trench with a second dielectric material to form a dielectric feature extending from the first sidewall to the second sidewall and on the first dielectric material;

removing the patterned dummy layer after filling the trench and forming the dielectric feature; and depositing at least one conductive layer having a first portion over the first gate structure and a second portion of the second gate structure, wherein the dielectric feature interposes the first portion and the second portion.

2. The method of claim 1, further comprising:
depositing insulating material over the first and second portions of the conductive layer.

3. The method of claim 1, further comprising:
forming a conductive via to the second portion of the conductive layer.

4. The method of claim 1, wherein the patterning the dummy layer to form the trench includes selectively etching material of the dummy layer while substantially not etching the first gate structure or the second gate structure.

5. The method of claim 1, wherein the depositing the at least one conductive layer includes depositing a seed layer and an overlying metal layer.

6. The method of claim 1 wherein the depositing the at least one conductive layer includes depositing conductive material of the at least one conductive layer having a rounded terminal region abutting the dielectric feature.

7. The method of claim 1, further comprising:
after depositing the dummy layer and prior to patterning the dummy layer, performing a chemical mechanical polish process on the dummy layer.

8. The method of claim 1, further comprising:
forming a third gate structure of a third gate all around (GAA) device over the substrate; and wherein the depositing at least one conductive layer having the first portion over the first gate structure includes the first portion extending over the third gate structure.

9. The method of claim 1, wherein the depositing at least one conductive layer having the first portion over the first gate structure includes depositing the at least one conductive layer directly interfacing a gate electrode layer of the first gate structure.

10. A method including,
forming a first gate structure, a second gate structure, and a third gate structure over a substrate;
depositing a dummy layer over the first gate structure, the second gate structure, and the third gate structure;
patterning the dummy layer, wherein the patterning the dummy layer includes:
 forming a trench in the dummy layer over an area between the second gate structure and the third gate structure, wherein the trench interposes a first contiguous portion of the dummy layer over the first gate structure and the second gate structure and a second contiguous portion of the dummy layer over the third gate structure such that the trench exposes a sidewall of the first contiguous portion of the dummy layer and a sidewall of the second contiguous portion of the dummy layer;
 filling the trench with a dielectric material to form a dielectric feature interfacing the sidewall of the first contiguous portion and interfacing the sidewall of the second contiguous portion;
after filling the trench to form the dielectric feature, removing the first contiguous portion of the dummy layer to form a first opening and the second contiguous portion of the dummy layer to form a second opening; and
depositing at least one conductive layer in the first opening and the second opening.

11. The method of claim 10 wherein the depositing the at least one conductive layer includes depositing a seed layer directly on a gate electrode of the first gate structure and the second gate structure.

12. The method of claim 10, wherein the at least one conductive layer electrically connects the first gate structure and the second gate structure and wherein the at least one conductive layer interfaces the dielectric feature.

13. The method of claim 10, further comprising:
forming a seed layer on a gate electrode layer of the first gate structure prior to depositing the dummy layer.

14. The method of claim 10, wherein the depositing at least one conductive layer in the first opening includes forming a seed layer on a gate electrode layer of the first gate structure.

15. The method of claim 10, further comprising:
depositing an etch stop layer on the first gate structure, wherein the etch stop layer interposes a gate electrode layer of the first gate structure and the at least one conductive layer.

16. A method including,
forming a first metal gate structure of a first gate all around (GAA) device over a substrate;
forming a second metal gate structure of a second GAA device over the substrate, the second metal gate structure spaced a first distance from the first metal gate structure;
forming a third metal gate structure of a third GAA device over the substrate, the third metal gate structure spaced a second distance from the second metal gate structure, the second metal gate structure interposing the first metal gate structure and third metal gate structure;
depositing a dummy layer over the first metal gate structure, the second metal gate structure, and the third metal gate structure;
etching a trench within the dummy layer and over the second distance, wherein the trench exposes a portion of a top surface of the second metal gate structure and a portion of a top surface of the third metal gate structure;
filling the trench with a dielectric material to form a dielectric structure;
after filling the trench, removing the dummy layer to form a first opening over the first metal gate structure and the second metal gate structure and a second opening over the third metal gate structure, wherein a sidewall of the first opening is defined by the dielectric structure and a sidewall of the second opening is defined by the dielectric structure; and
depositing at least one conductive layer in the first opening and in the second opening.

17. The method of claim 16, wherein the depositing the at least one conductive layer includes depositing a conductive material contiguously extending from over the first metal gate structure to over the second metal gate structure.

18. The method of claim 16, further comprising:
depositing an insulating layer over the at least one conductive layer; and
planarizing the insulating layer.

19. The method of claim 18, wherein the planarizing provides a coplanar upper surface of the insulating layer and the dielectric structure.

20. The method of claim 16, wherein the forming the first metal gate structure includes:
forming a dummy gate structure;
removing the dummy gate structure and releasing a channel region of the first GAA device; and
forming the first metal gate structure surrounding the channel region.

* * * * *